(12) United States Patent
Shimomura et al.

(10) Patent No.: US 8,314,018 B2
(45) Date of Patent: Nov. 20, 2012

(54) METHOD FOR MANUFACTURING SEMICONDUCTOR DEVICE

(75) Inventors: Akihisa Shimomura, Atsugi (JP); Naoki Okuno, Sagamihara (JP); Masaki Koyama, Atsugi (JP); Yasuhiro Jinbo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 161 days.

(21) Appl. No.: 12/901,005

(22) Filed: Oct. 8, 2010

(65) Prior Publication Data

US 2011/0092050 A1 Apr. 21, 2011

(30) Foreign Application Priority Data

Oct. 15, 2009 (JP) ................................. 2009-237928

(51) Int. Cl.
*H01L 21/425* (2006.01)
*H01L 21/46* (2006.01)

(52) U.S. Cl. ........ 438/514; 438/455; 438/459; 438/977; 257/E21.568

(58) Field of Classification Search .................. 438/455, 438/459, 506–509, 514, 977; 257/E21.568
See application file for complete search history.

(56) References Cited

U.S. PATENT DOCUMENTS

| 5,189,500 | A | 2/1993 | Kusunoki |
| 6,372,609 | B1 | 4/2002 | Aga et al. |
| 6,770,507 | B2 * | 8/2004 | Abe et al. ........................ 438/64 |
| 2009/0111248 | A1 | 4/2009 | Ohnuma et al. |
| 2010/0120224 | A1 | 5/2010 | Shimomura et al. |

FOREIGN PATENT DOCUMENTS

| JP | 03-018050 | 1/1991 |
| JP | 03-285351 | 12/1991 |
| JP | 2006-012995 | 1/2006 |

* cited by examiner

*Primary Examiner* — Michelle Mandala
(74) *Attorney, Agent, or Firm* — Eric J. Robinson; Robinson Intellectual Property Law Office, P.C.

(57) ABSTRACT

A first embrittlement layer is formed by doping a first single-crystal semiconductor substrate with a first ion; a second embrittlement layer is formed by doping a second single-crystal semiconductor substrate with a second ion; the first and second single-crystal semiconductor substrates are bonded to each other; the first single-crystal semiconductor film is formed over the second single-crystal semiconductor substrate by a first heat treatment; an insulating substrate is bonded over the first single-crystal semiconductor film; and the first and second single-crystal semiconductor films are formed over the insulating substrate by a second heat treatment. A dose of the first ion is higher than that of the second ion and a temperature of the first heat treatment is lower than that of the second heat treatment.

10 Claims, 20 Drawing Sheets

METHOD FOR MANUFACTURING SEMICONDUCTOR DEVICE

BACKGROUND OF THE INVENTION

1. Field of the Invention

The technical field relates to a method for manufacturing a semiconductor device including a single-crystal semiconductor film.

2. Description of the Related Art

A method for manufacturing a stacked semiconductor device including a transistor in a lower layer and a transistor in an upper layer is disclosed in Patent Document 1. The transistor in a lower layer is formed over a silicon substrate, an interlayer insulating film is formed over the transistor in a lower layer, and a polysilicon film used for the transistor in an upper layer is formed over the interlayer insulating film in Patent Document 1.

[Reference]

[Patent Document 1] Japanese Published Patent Application No. H3-18050

SUMMARY OF THE INVENTION

A polysilicon film is formed of many single-crystal grains. The polysilicon film has a crystal grain boundary between a single-crystal grain and another single-crystal grain. Therefore, mobility of a polysilicon film is smaller than that of a single-crystal silicon film.

When a transistor in a lower layer and a transistor in an upper layer are formed over a light-transmitting insulating substrate such as a glass substrate, two single-crystal semiconductor films are stacked with an insulating film interposed therebetween. A high temperature (e.g., a temperature exceeding 600° C.) is required for forming a single-crystal semiconductor film without limitation to silicon; however an insulating substrate such as a glass substrate cannot be subjected to a heat treatment at a high temperature.

Thus, a method for stacking two single-crystal semiconductor films (a first single-crystal semiconductor film and a second single-crystal semiconductor film) over an insulating substrate, that is, a method for manufacturing a semiconductor device including a first single-crystal semiconductor film over an insulating substrate and a second single-crystal semiconductor film over the first single-crystal semiconductor film is provided.

In order to solve a problem, the present inventors studied a method in which a single-crystal semiconductor substrate is doped with ions to form an embrittlement layer, the single-crystal semiconductor substrate is bonded to a base substrate which is an insulating substrate, and part of the single-crystal semiconductor substrate is separated by performing a heat treatment. Then, the following experiment was carried out focusing on a dose of ions at the time of forming an embrittlement layer.

EXPERIMENT

A change in temperature at which part of a single-crystal semiconductor substrate was separated when the dose of ions to the single-crystal semiconductor substrate was changed was investigated. Here, a single-crystal silicon substrate was used as the single-crystal semiconductor substrate and a hydrogen ion was used as an ion.

As illustrated in FIGS. 18A and 18B, a first single-crystal silicon substrate 1001 having a main surface with a surface orientation of (100) and a second single-crystal silicon substrate 1002 having a main surface with a surface orientation of (100) were prepared. The first single-crystal silicon substrate 1001 was doped with hydrogen ions at an accelerating voltage of 40 kV and a dose of hydrogen ions of $2.6 \times 10^{16}$ cm$^{-2}$ (cm$^{-2}$ is also referred to as ions/cm$^2$ or atoms/cm$^2$) to form a first embrittlement layer 1003. Meanwhile, the second single-crystal silicon substrate 1002 was doped with hydrogen ions at an accelerating voltage of 40 kV and a dose of hydrogen ions of $2.0 \times 10^{16}$ cm$^{-2}$ to form a second embrittlement layer 1004 (FIG. 18A).

Insulating substrates 1005 and 1006 (glass substrates AN100 manufactured by Asahi Glass Co., Ltd.) which serve as base substrates were prepared. The first single-crystal silicon substrate 1001 and the insulating substrate 1005 were bonded to each other, and the second single-crystal silicon substrate 1002 and the insulating substrate 1006 were bonded to each other (FIG. 18B).

The bonded first single-crystal silicon substrate 1001 and insulating substrate 1005 were provided over a hot plate of a stress measurement apparatus and heated from a room temperature at a temperature rising rate of 7.0° C./min in order to measure stress and the amount of bent of the insulating substrate 1005. In a similar manner, the bonded second single-crystal silicon substrate 1002 and insulating substrate 1006 were provided over a hot plate of a stress measurement apparatus and heated from a room temperature at a temperature rising rate of 7.0° C./min in order to measure stress and the amount of bent of the insulating substrate 1006.

When heating is performed with the hot plate, the volume of microvoids formed in the first embrittlement layer 1003 in the first single-crystal silicon substrate 1001 was changed and the first embrittlement layer 1003 was cracked at a certain temperature. As a result, separation of part of the first single-crystal silicon substrate 1001 was caused along the first embrittlement layer 1003. At that time, the stress and the amount of bent of the insulating substrate 1005 were largely changed. It can be considered that part of the first single-crystal silicon substrate 1001 be separated at the certain temperature. The same can be applied to the second single-crystal silicon substrate 1002, and when heating was performed with the hot plate, separation of part of the second single-crystal silicon substrate 1002 was caused along the second embrittlement layer 1004. At that time, the stress and the amount of bent of the insulating substrate 1006 were largely changed.

FIG. 19 shows relationships between stress (MPa) and temperature (° C.) of the insulating substrates 1005 and 1006. In FIG. 19, the scale 2.0E+04 of a vertical axis indicates $2.0 \times 10^4$ and the scale −8.0E+04 of the vertical axis indicates $-8.0 \times 10^4$. The other scales of the vertical axis can be understood similarly. FIG. 20 shows relationships between the amount of bent of a substrate (μm) and temperature (° C.) of the insulating substrates 1005 and 1006. From the relationship between stress and temperature of the insulating substrate 1005 and the relationship between the amount of bent of a substrate and temperature of the insulating substrate 1005, the stress and the amount of bent of a substrate of the insulating substrate 1005 were significantly changed at a temperature of around 470° C. On the other hand, from the relationship between stress and temperature of the insulating substrate 1006 and the relationship between the amount of bent of a substrate and temperature of the insulating substrate 1006, the stress and the amount of bent of a substrate of the insulating substrate 1006 were significantly changed at a temperature of around 500° C. It was found that the stress and the amount of bent of a substrate of the insulating substrate 1005 having high dose were changed at a lower temperature than those of the insulating substrate 1006 having low dose.

Accordingly, it was found that the first single-crystal silicon substrate 1001 was separated at a lower temperature than the second single-crystal silicon substrate 1002.

According to the above described experiment results, it was found that, in the case of the high dose of ions, the temperature at which the stress and the amount of bent of a substrate was significantly changed, in other words, the temperature at which part of a single-crystal semiconductor substrate was separated can be lower than the case of the low dose of ions.

The present inventors found that the above problem can be solved by the following method. A dose of first ions in formation of a first embrittlement layer by doping a first single-crystal semiconductor substrate with the first ions is set higher than a dose of second ions in formation of a second embrittlement layer by doping a second single-crystal semiconductor substrate with the second ions. Then, the temperature at which part of the first single-crystal semiconductor substrate is separated along the first embrittlement layer and a first single-crystal semiconductor film is formed is set lower than the temperature at which part of the second single-crystal semiconductor substrate is separated along the second embrittlement layer and a second single-crystal semiconductor film is formed.

A first single-crystal semiconductor substrate 1 is doped with first ions, thereby forming a first embrittlement layer 3. A second single-crystal semiconductor substrate 2 is doped with second ions, thereby forming a second embrittlement layer 4 (FIG. 1A). In the above description, the dose of the first ions is higher than the dose of the second ions. The second ions may be the same as the first ions. In addition, an accelerating voltage of the second ions may be the same as that of the first ions.

The first single-crystal semiconductor substrate 1 and the second single-crystal semiconductor substrate 2 are bonded to each other (FIG. 1B). A first heat treatment is performed and part of the first single-crystal semiconductor substrate 1 is separated along the first embrittlement layer 3 selectively, whereby a first single-crystal semiconductor film 1' is formed (FIG. 1C). At this time, the second single-crystal semiconductor substrate 2 is not separated.

The first single-crystal semiconductor film 1' and an insulating substrate 5 are bonded to each other (FIGS. 2A and 2B). A second heat treatment is performed and part of the second single-crystal semiconductor substrate 2 is separated along the second embrittlement layer 4, whereby a second single-crystal semiconductor film 2' is formed (FIG. 2C). The temperature of the second heat treatment is higher than that of the first heat treatment; in other words, the temperature of the first heat treatment is lower than that of the second heat treatment. By making the dose of the first ions higher than that of the second ions, the temperature of the first heat treatment can be lower than that of the second heat treatment. Accordingly, the first single-crystal semiconductor substrate 1 can be separated selectively by the first heat treatment.

The first and second ions include $H^+$, $H_2^+$, or $H_3^+$. The dose of the first ions is $2.5\times10^{16}$ cm$^{-2}$ to $2.7\times10^{16}$ cm$^{-2}$ and that of the second ions is $1.9\times10^{16}$ cm$^{-2}$ to $2.1\times10^{16}$ cm$^{-2}$. The temperature of the first heat treatment is 470° C. to 480° C. inclusive and that of the second heat treatment may be 490° C. to 600° C. inclusive. Difference in dose between the first ions and the second ions may be equal to or more than $0.6\times10^{16}$ cm$^{-2}$. Difference in temperature between the first heat treatment and the second heat treatment may be equal to or more than 20° C.

First Mode of the present invention is a manufacturing method of a semiconductor device. In the manufacturing method: a first embrittlement layer is formed by doping a first single-crystal semiconductor substrate with first ions; a second embrittlement layer is formed by doping a second single-crystal semiconductor substrate with second ions; the first single-crystal semiconductor substrate and the second single-crystal semiconductor substrate are bonded to each other; a first single-crystal semiconductor film is formed over the second single-crystal semiconductor substrate by separating part of the first single-crystal semiconductor substrate along the first embrittlement layer by a first heat treatment; an insulating substrate is bonded over the first single-crystal semiconductor film; and the first single-crystal semiconductor film and a second single-crystal semiconductor film are formed over the insulating substrate by separating part of the second single-crystal semiconductor substrate along the second embrittlement layer by a second heat treatment. In the manufacturing method, the dose of the first ions is higher than that of the second ions and the temperature of the first heat treatment is lower than that of the second heat treatment. A semiconductor device including a first single-crystal semiconductor film over an insulating substrate such as a glass substrate, and a second single-crystal semiconductor film over the first single-crystal semiconductor film can be manufactured.

Second Mode of the present invention is a manufacturing method of a semiconductor device. In the manufacturing method: a first insulating film is formed over a surface of a first single-crystal semiconductor substrate; a second insulating film is formed over a surface of a second single-crystal semiconductor substrate; a first embrittlement layer is formed by doping the first single-crystal semiconductor substrate with first ions through the first insulating film; a second embrittlement layer is formed by doping the second single-crystal semiconductor substrate with second ions through the second insulating film; the first insulating film and the second insulating film are bonded to each other; a first single-crystal semiconductor film is formed over the second single-crystal semiconductor substrate with the first insulating film and the second insulating film interposed therebetween by separating part of the first single-crystal semiconductor substrate along the first embrittlement layer by a first heat treatment; a third insulating film is formed over the first single-crystal semiconductor film; the third insulating film and an insulating substrate are bonded to each other; and a second single-crystal semiconductor film is formed over the insulating substrate with the third insulating film, the first single-crystal semiconductor film, the first insulating film, and the second insulating film interposed therebetween by separating part of the second single-crystal semiconductor substrate along the second embrittlement layer by a second heat treatment. In the manufacturing method, the dose of the first ions is higher than that of the second ions and the temperature of the first heat treatment is lower than that of the second heat treatment. A semiconductor device including a first single-crystal semiconductor film over an insulating substrate such as a glass substrate, and a second single-crystal semiconductor film over the first single-crystal semiconductor film can be manufactured. In addition, the first insulating film and the second insulating film are firmly attached to each other by bonding the first insulating film and the second insulating film. The third insulating film and the insulating substrate are firmly attached to each other by bonding the third insulating film and the insulating substrate. The third insulating film prevents incorporation of an impurity from the insulating substrate. Further, a step may be included in which an island-shaped second single-crystal semiconductor film is formed by selectively removing the second single-crystal semiconductor film over the insulating substrate and the first single-crystal semiconductor film is exposed by removing part of the first and second insulating films. The first single-crystal semiconductor film can be used for an active layer of one transistor, and the second single-crystal semiconductor film can also be used for an active layer of another transistor.

In the First Mode and the Second Mode, the first and the second ions include $H^+$, $H_2^+$, or $H_3^+$. The dose of the first ions is $2.5\times10^{16}$ cm$^{-2}$ to $2.7\times10^{16}$ cm$^{-2}$ and that of the second ions is $1.9\times10^{16}$ cm$^{-2}$ to $2.1\times10^{16}$ cm$^{-2}$. The temperature of the first heat treatment is 470° C. to 480° C. inclusive and that of the second heat treatment may be 490° C. to 600° C. inclusive. A first single-crystal semiconductor film and a second single-crystal semiconductor film can be formed over an insulating substrate such as a glass substrate in this order without using a high temperature treatment.

Third Mode of the present invention is a manufacturing method of a semiconductor device. In the manufacturing method: a first embrittlement layer is formed by doping a first single-crystal semiconductor substrate with first ions; a second embrittlement layer is formed by doping a second single-crystal semiconductor substrate with second ions; a third embrittlement layer is formed by doping a third single-crystal semiconductor substrate with the first ions; a fourth embrittlement layer is formed by doping a fourth single-crystal semiconductor substrate with the second ions; the first single-crystal semiconductor substrate and the second single-crystal semiconductor substrate are bonded to each other; the third single-crystal semiconductor substrate and the fourth single-crystal semiconductor substrate are bonded to each other; a first single-crystal semiconductor film is formed over the second single-crystal semiconductor substrate by separating part of the first single-crystal semiconductor substrate along the first embrittlement layer by a first heat treatment; a third single-crystal semiconductor film is formed over the fourth single-crystal semiconductor substrate by separating part of the third single-crystal semiconductor substrate along the third embrittlement layer by a second heat treatment; an insulating substrate is bonded over the first single-crystal semiconductor film and the third single-crystal semiconductor film; and the first single-crystal semiconductor film and a second single-crystal semiconductor film are formed over the insulating substrate by separating part of the second single-crystal semiconductor substrate along the second embrittlement layer by a third heat treatment and the third single-crystal semiconductor film and a fourth single-crystal semiconductor film are formed over the insulating substrate by separating part of the fourth single-crystal semiconductor substrate along the fourth embrittlement layer by the third heat treatment. In the manufacturing method, the dose of the first ions is higher than that of the second ions and the temperatures of the first and the second heat treatments are lower than that of the third heat treatment. In the case where the size of the insulating substrate is larger than the total size of the first to fourth single-crystal semiconductor substrates, the single-crystal semiconductor films can be formed at a plurality of desired positions over the insulating substrate. Alternatively, the single-crystal semiconductor films can be formed to be arranged in a tile pattern. In addition, the first and the second ions include $H^+$, $H_2^+$, or $H_3^+$. The dose of the first ions is $2.5\times10^{16}$ cm$^{-2}$ to $2.7\times10^{16}$ cm$^{-2}$ and that of the second ions is $1.9\times10^{16}$ cm$^{-2}$ to $2.1\times10^{16}$ cm$^{-2}$. The temperatures of the first and the second heat treatments are 470° C. to 480° C. inclusive and that of the third heat treatment may be 490° C. to 600° C. inclusive. A single-crystal semiconductor film can be formed over an insulating substrate such as a glass substrate without using a high temperature treatment.

Fourth Mode of the present invention is a manufacturing method of a semiconductor device. In the manufacturing method: a first insulating film is formed over a surface of a first single-crystal semiconductor substrate; a second insulating film is formed over a surface of a second single-crystal semiconductor substrate; a third insulating film is formed over a surface of a third single-crystal semiconductor substrate; a fourth insulating film is formed over a surface of a fourth single-crystal semiconductor substrate; a first embrittlement layer is formed by doping the first single-crystal semiconductor substrate with first ions through the first insulating film; a second embrittlement layer is formed by doping the second single-crystal semiconductor substrate with second ions through the second insulating film; a third embrittlement layer is formed by doping the third single-crystal semiconductor substrate with the first ions through the third insulating film; a fourth embrittlement layer is formed by doping the fourth single-crystal semiconductor substrate with the second ions through the fourth insulating film; the first insulating film and the second insulating film are bonded to each other; the third insulating film and the fourth insulating film are bonded to each other; a first single-crystal semiconductor film is formed over the second single-crystal semiconductor substrate with the first insulating film and the second insulating film interposed therebetween by separating part of the first single-crystal semiconductor substrate along the first embrittlement layer by a first heat treatment and a third single-crystal semiconductor film is formed over the fourth single-crystal semiconductor substrate with the third insulating film and the fourth insulating film interposed therebetween by separating part of the third single-crystal semiconductor substrate along the third embrittlement layer by the first heat treatment; a fifth insulating film is formed over the first single-crystal semiconductor film; a sixth insulating film is formed over the third single-crystal semiconductor film; the fifth insulating film and an insulating substrate are bonded to each other; the sixth insulating film and the insulating substrate are bonded to each other; and a second single-crystal semiconductor film is formed over the insulating substrate with the fifth insulating film, the first single-crystal semiconductor film, the second insulating film and the first insulating film interposed therebetween by separating part of the second single-crystal semiconductor substrate along the second embrittlement layer by a second heat treatment and a fourth single-crystal semiconductor film is formed over the insulating substrate with the sixth insulating film, the third single-crystal semiconductor film, the fourth insulating film and the third insulating film interposed therebetween by separating part of the fourth single-crystal semiconductor substrate along the fourth embrittlement layer by the second heat treatment. In the manufacturing method, the dose of the first ions is higher than that of the second ions and the temperature of the first heat treatment is lower than that of the second heat treatment. In the case where the size of the insulating substrate is larger than the total size of the first to fourth single-crystal semiconductor substrates, the single-crystal semiconductor films can be formed at a plurality of desired positions over the insulating substrate. Alternatively, the single-crystal semiconductor films can be formed to be arranged in a tile pattern. In addition, an insulating film and another insulating film are firmly attached to each other by bonding the insulating film and another insulating film. Further, an insulating film and the insulating substrate are firmly attached to each other by bonding the insulating film and the insulating substrate. The insulating film prevents incorporation of an impurity from the insulating substrate. Further, steps may be included in which: an island-shaped second single-crystal semiconductor film is formed by selectively removing the second single-crystal semiconductor film over the insulating substrate and the first single-crystal semiconductor film is exposed by removing part of the first and second insulating films; an island-shaped fourth single-crystal semiconductor film is formed by selectively removing the fourth single-crystal semiconductor film over the insulating substrate and the third single-crystal semiconductor film is exposed by removing part of the third and fourth insulating films. Any of the single-crystal semiconductor films can be used for an active layer of a transistor. The first and the second ions include $H^+$, $H_2^+$, or $H_3^+$. The dose of the first ions is $2.5\times10^{16}$ $cm^{-2}$ to $2.7\times10^{16}$ $cm^{-2}$ and that of the second ions is $1.9\times10^{16}$ $cm^{-2}$ to $2.1\times10^{16}$ $cm^{-2}$. The temperature of the first heat treatment is 470° C. to 480° C. inclusive and that of the second heat treatment may be 490° C. to 600° C. inclusive. A single-crystal semiconductor film can be formed over an insulating substrate such as a glass substrate without using a high temperature treatment.

A dose of first ions with which a first single-crystal semiconductor substrate is doped in formation of a first embrittlement layer is made higher than a dose of second ions with which a second single-crystal semiconductor substrate is doped in formation of a second embrittlement layer. In addition, the temperature at which part of the first single-crystal semiconductor substrate is separated along the first embrittlement layer and a first single-crystal semiconductor film is formed is set lower than the temperature at which part of the second single-crystal semiconductor substrate is separated along the second embrittlement layer and a second single-crystal semiconductor film is formed. Thus, a semiconductor device including the first single-crystal semiconductor film over an insulating substrate such as a glass substrate, and the second single-crystal semiconductor film over the first single-crystal semiconductor film can be manufactured. By this method, a semiconductor device can be manufactured over an insulating substrate such as a glass substrate without using a high temperature treatment at a temperature of exceeding 600° C.

BRIEF DESCRIPTION OF THE DRAWINGS

In the accompanying drawings.

DETAILED DESCRIPTION OF THE INVENTION

Figure 1A:
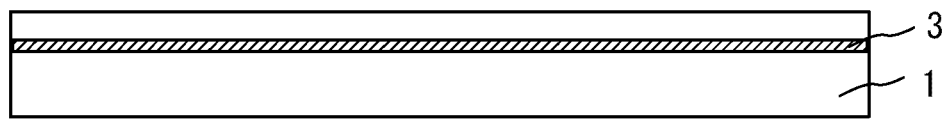
FIGS. 1A to 1C are views illustrating one embodiment of the present invention.

Embodiments of the present invention will be described below. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments. Note that the same reference numerals are given in common to the same portions or portions having similar functions in different drawings, and repetitive explanation will be omitted in some cases.
[Embodiment 1]

Embodiment 1 discloses a manufacturing method of a semiconductor device. In the manufacturing method: a first insulating film is formed over a surface of a first single-crystal semiconductor substrate; a second insulating film is formed over a surface of a second single-crystal semiconductor substrate; a first embrittlement layer is formed by doping the first single-crystal semiconductor substrate with first ions through the first insulating film; a second embrittlement layer is formed by doping the second single-crystal semiconductor substrate with second ions through the second insulating film; the first insulating film and the second insulating film are bonded to each other; a first single-crystal semiconductor film is formed over the second single-crystal semiconductor substrate with the first insulating film and the second insulating film interposed therebetween by separating part of the first single-crystal semiconductor substrate along the first embrittlement layer by a first heat treatment; a third insulating film is formed over the first single-crystal semiconductor film; the third insulating film and an insulating substrate are bonded to each other; and a second single-crystal semiconductor film is formed over the insulating substrate with the third insulating film, the first single-crystal semiconductor film, the second insulating film, and the first insulating film interposed therebetween by separating part of the second single-crystal semiconductor substrate along the second embrittlement layer by a second heat treatment. In the manufacturing method, the dose of the first ions is higher than that of the second ions and the temperature of the first heat treatment is lower than that of the second heat treatment.

Figure 3A:
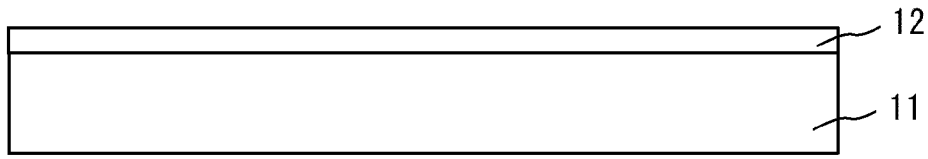
FIGS. 3A to 3C are views illustrating a manufacturing method of Embodiment 1.
Figure 3A:
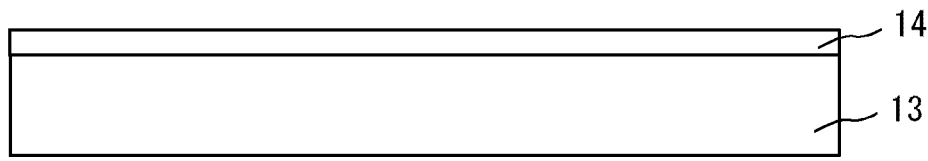

A first insulating film 12 is formed over a first single-crystal semiconductor substrate 11. A second insulating film 14 is formed over a second single-crystal semiconductor substrate 13 (FIG. 3A).

A single-crystal silicon substrate or the like is used as the first single-crystal semiconductor substrate 11 and the second single-crystal semiconductor substrate 13.

As the first insulating film 12 and the second insulating film 14, a single layer of an insulating film such as a silicon oxide film, a silicon oxynitride film, a silicon nitride film, or a silicon nitride oxide film, or stacked layers of any of these films can be formed. The first insulating film 12 and the second insulating film 14 are formed by a thermal oxidation method, a CVD method, a sputtering method, or the like.

In the case where the silicon oxide film is formed by a CVD method, organosilane such as tetraethoxysilane (abbreviation: TEOS, chemical formula: $Si(OC_2H_5)_4$) is preferably used in terms of productivity.

In order to form the first insulating film 12 and the second insulating film 14, single-crystal silicon substrates may be used for the first single-crystal semiconductor substrate and the second single-crystal semiconductor substrate, and thermal oxidation may be performed on the single-crystal silicon substrates to form silicon oxide films. In this case, it is preferable to add a halogen to an oxidation atmosphere. For example, thermal oxidation treatment is performed on the single-crystal silicon substrates in an oxidation atmosphere to which chlorine (Cl) is added, whereby silicon oxide films are formed through chlorine oxidation. The silicon oxide films contain chlorine atoms, for example, at a concentration of $1\times10^{17}$ atoms/cm$^3$ to $1\times10^{21}$ atoms/cm$^3$. For example, thermal oxidation treatment can be performed in an oxidation atmosphere which contains hydrogen chloride (HCl) at a proportion of 0.5 vol. % to 10 vol. % (preferably 3 vol. %) with respect to oxygen at a temperature of 900° C. to 1150° C. (typically 1000° C.). Treatment time may be 0.1 to 6 hours, preferably, 0.5 to 1 hours. The thickness of the silicon oxide film to be formed may be comprised between 10 nm and 1000 nm (preferably between 50 nm and 300 nm), and for example, the thickness is 100 nm.

With the chlorine atoms contained in the silicon oxide film, heavy metal (e.g., Fe, Cr, Ni, or Mo) that is an extrinsic impurity can be captured, so that contamination of the single-crystal silicon substrate can be prevented. In addition, an impurity (e.g., a mobile ion such as Na) that adversely affects the single-crystal silicon substrate can be gettered. By heat treatment which is performed after the formation of the silicon oxide film, impurities included in the single-crystal silicon substrate are separated out to the silicon oxide film and captured by reacting with the halogen (e.g., chlorine). The impurity captured in the silicon oxide film is fixed. Accordingly, contamination of the single-crystal silicon substrate can be prevented. Contamination of a semiconductor substrate can be prevented in the case where a semiconductor substrate is not sufficiently cleaned or the case where a semiconductor substrate is reused repeatedly.

Further, halogen atoms contained in the silicon oxide film are not limited to the chlorine atoms. The silicon oxide film may contain fluorine atoms. In order to perform fluorine oxidation on a surface of the single-crystal silicon substrate, thermal oxidation treatment may be performed in an oxidation atmosphere after immersion of the surface of the single-crystal silicon substrate into hydrofluoric acid, or thermal oxidation treatment may be performed in an oxidation atmosphere to which $NF_3$ is added.

Figure 3B:
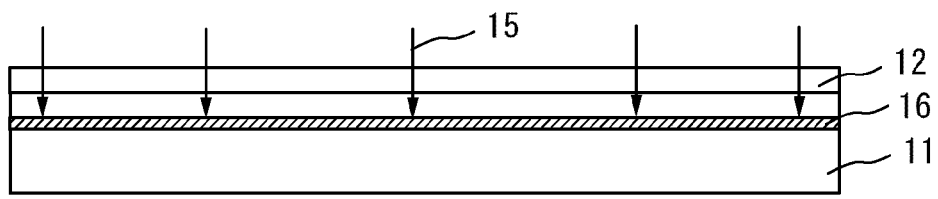
Figure 3B:
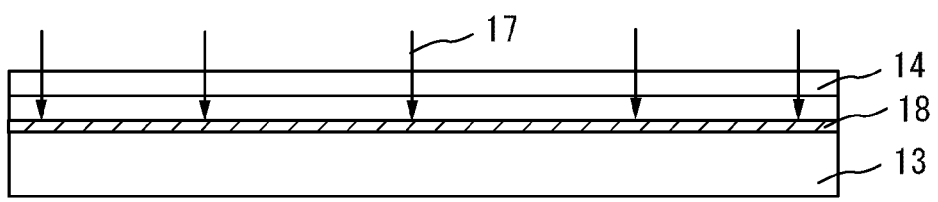

A first embrittlement layer 16 is formed by doping the first single-crystal semiconductor substrate 11 with a first ion 15 through the first insulating film 12. Meanwhile, a second embrittlement layer 18 is formed by doping the second single-crystal semiconductor substrate 13 with a second ion 17 through the second insulating film 14 (FIG. 3B). The first ion 15 and the second ion 17 are ions (such as $H^+$, $H_2^+$, or $H_3^+$) which are generated from, for example, hydrogen ($H_2$) gas, gas containing a hydrogen atom (for example, $PH_3$ or $B_2H_6$), or the like. Doping may be performed with ions generated from helium (He) gas simultaneously with the above ions.

The dose of the first ion 15 is $2.5\times10^{16}$ cm$^{-2}$ to $2.7\times10^{16}$ cm$^{-2}$; the dose is $2.6\times10^{16}$ cm$^{-2}$ for example. On the other hand, the dose of the second ion 17 is $1.9\times10^{16}$ cm$^{-2}$ to $2.1\times10^{16}$ cm$^{-2}$; the dose is $2.0\times10^{16}$ cm$^{-2}$ for example. Difference in dose between the first ion 15 and the second ion 17 may be equal to or more than $0.6\times10^{16}$ cm$^{-2}$. Accordingly, the temperature of the first heat treatment, by which part of the first single-crystal semiconductor substrate 11 is separated along the first embrittlement layer 16 so as to form a first single-crystal semiconductor film 19, can be 470° C. to 480° C. inclusive. In addition, the temperature of the second heat treatment, by which part of the second single-crystal semiconductor substrate 13 is separated along the second embrittlement layer 18 so as to form a second single-crystal semiconductor film 22, can be higher than or equal to 490° C.

Accelerating voltage of the first ion 15 is adjusted so that the first embrittlement layer 16 is formed at a depth of greater than or equal to 50 nm and less than or equal to 200 nm from a surface of the first single-crystal semiconductor substrate 11. Accelerating voltage of the second ion 17 is adjusted so that the second embrittlement layer 18 is formed at a depth of greater than or equal to 50 nm and less than or equal to 200 nm from a surface of the second single-crystal semiconductor substrate 13. For example, the accelerating voltage is set at 10 kV to 100 kV. The accelerating voltage of the first ion 15 and that of the second ion 17 may be the same.

The proportion of $H_3^+$ with respect to the total amount of the ion species ($H^+$, $H_2^+$, or $H_3^+$) generated from the $H_2$ gas or the gas containing a hydrogen atom is 50% or more, preferably 70% or more. With an increased proportion of $H_3^+$, the takt time of the ion irradiation step can be shortened, and productivity and throughput can be improved.

Figure 3C:
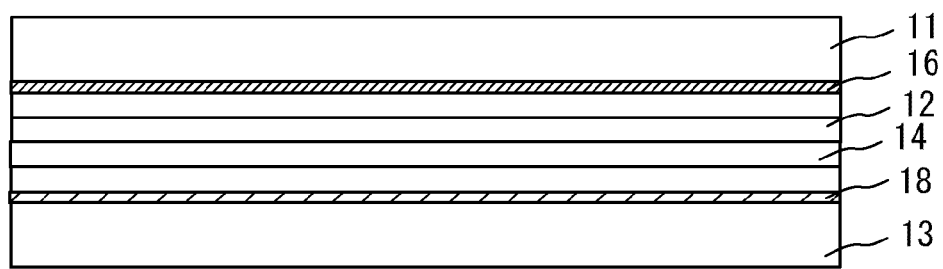

The first single-crystal semiconductor substrate 11 and the second single-crystal semiconductor substrate 13 are bonded to each other so that the first insulating film 12 and the second insulating film 14 face each other (FIG. 3C). Specifically, a surface of the first insulating film 12 and a surface of the second insulating film 14 are bonded to each other. Alignment at the time of bonding is facilitated by using the first single-crystal semiconductor substrate 11 and the second single-crystal semiconductor substrate 13 having the same size. Although the first insulating film 12 and the second insulating film 14 are not necessarily formed, the first insulating film 12 and the second insulating film 14 are firmly attached when the first insulating film 12 and the second insulating film 14 are formed and bonded to each other.

Figure 4A:
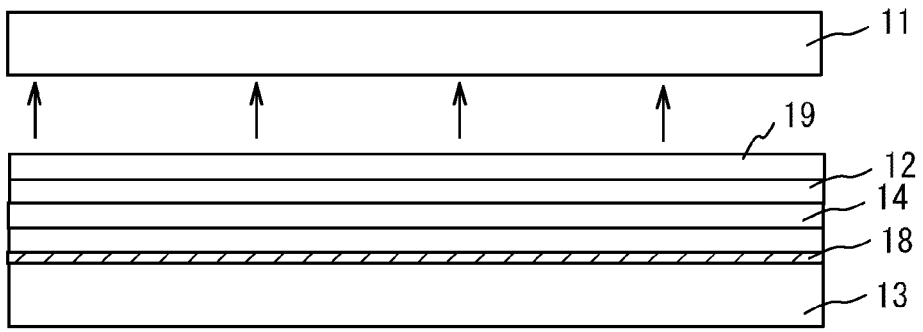
FIGS. 4A to 4C are views illustrating a manufacturing method of Embodiment 1.

After the first single-crystal semiconductor substrate 11 and the second single-crystal semiconductor substrate 13 are bonded to each other, the first heat treatment is performed at the temperature of 470° C. to 480° C. inclusive. For example, the treatment time is 0.5 minute to 300 minutes. The volume of microvoids in the first embrittlement layer 16 is changed and the first embrittlement layer 16 is cracked by the first heat treatment. As a result, separation of part of the first single-crystal semiconductor substrate 11 can be caused along the first embrittlement layer 16 and the first single-crystal semiconductor film 19 which is separated from the first single-crystal semiconductor substrate 11 is formed over the second single-crystal semiconductor substrate 13 (FIG. 4A). On the other hand, since the second embrittlement layer 18 is doped with the second ion 17 at a lower dose than the first ion 15, the second single-crystal semiconductor substrate 13 is not separated by the first heat treatment.

For the first heat treatment, a diffusion furnace, a heating furnace such as a resistance heating furnace, a rapid thermal annealing (RTA) apparatus, a microwave heating apparatus, or the like can be used.

When the surface of the first single-crystal semiconductor film 19 is uneven, planarization is performed by chemical mechanical polishing (CMP), annealing, or the like. By performing laser annealing, RTA, flash lamp annealing, or the like on the first single-crystal semiconductor film 19, the surface of the first single-crystal semiconductor film 19 can be planarized and crystallinity of the first single-crystal semiconductor film 19 can be recovered.

Figure 4B:
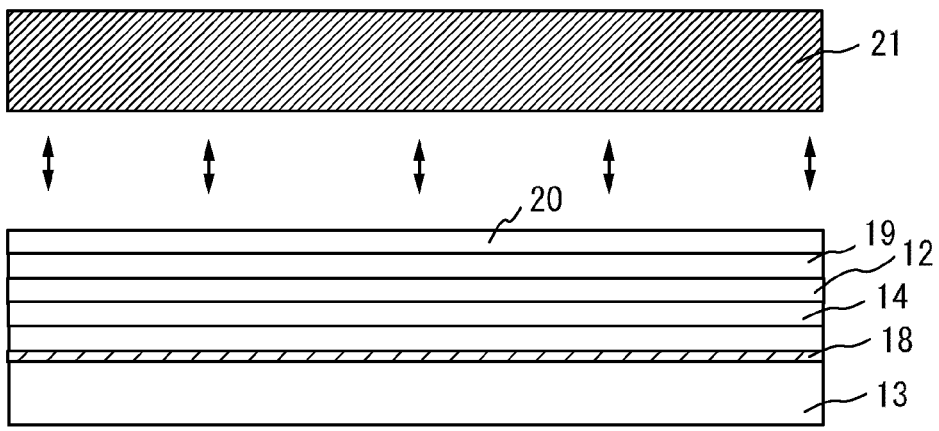

A third insulating film 20 is formed over the first single-crystal semiconductor film 19 (FIG. 4B). The third insulating film 20 may be an insulating film similar to the first insulating film 12 and the second insulating film 14. In addition, the third insulating film 20 is formed in a manner similar to that of the first insulating film 12 and the second insulating film 14.

Figure 4C:
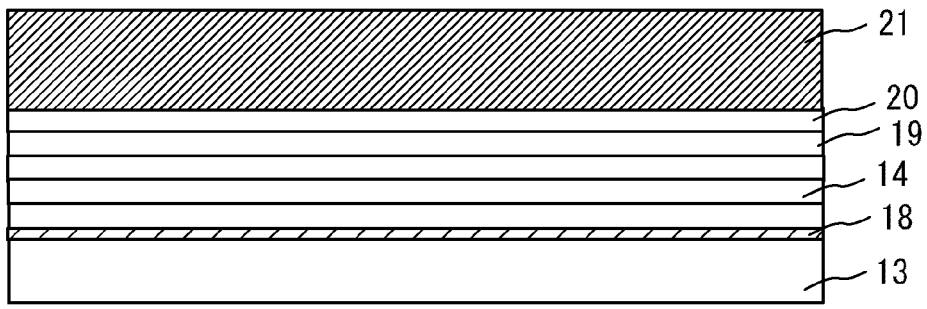

Next, a substrate 21 which is to be a base substrate is prepared (FIG. 4B), and the substrate 21 is bonded to the second single-crystal semiconductor substrate 13 (FIG. 4C). Specifically, a surface of the third insulating film 20 and a surface of the substrate 21 are bonded to each other. Alignment at the time of bonding is facilitated by using the substrate 21 and the second single-crystal semiconductor substrate 13 having the same size. Although the third insulating film 20 is not necessarily formed, the third insulating film 20 and the substrate 21 are firmly attached when the third insulating film 20 and the substrate 21 are formed and bonded to each other.

As the substrate 21, an insulating substrate can be used, for example. For example, a glass substrate is preferably used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, as the base substrate 21, a single-crystal semiconductor substrate (such as a single-crystal silicon substrate) or a polycrystalline semiconductor substrate (such as a polycrystalline silicon substrate) may be used.

Figure 5A:
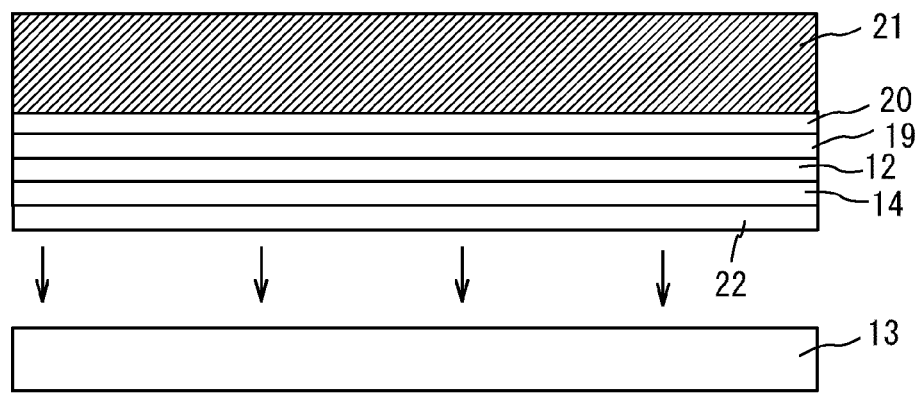
FIGS. 5A to 5C are views illustrating a manufacturing method of Embodiment 1.

After the second single-crystal semiconductor substrate 13 and the substrate 21 are bonded to each other, the second heat treatment is performed at a temperature of higher than or equal to 490° C. For example, the treatment time is about 0.5 minute to 300 minutes. As a result, separation of part of the second single-crystal semiconductor substrate 13 can be caused along the second embrittlement layer 18, so that a second single-crystal semiconductor film 22 is formed (FIG. 5A). Difference in temperature between the first heat treatment and the second heat treatment may be equal to or more than 20° C.

For the second heat treatment, a heating furnace, an RTA apparatus, a microwave heating apparatus, or the like can be used. The second heat treatment is performed at a temperature not exceeding the strain point of the substrate 21. Since a heat treatment is preferably performed at a low temperature, it is preferable that the second heat treatment be performed at a temperature of 490° C. to 600° C. inclusive.

When the surface of the second single-crystal semiconductor film 22 is uneven, planarization is performed by CMP, laser annealing, RTA, flash lamp annealing, or the like. By annealing treatment, the surface of the second single-crystal semiconductor film 22 can be planarized and crystallinity of the second single-crystal semiconductor film 22 can be recovered.

Figure 5B:

Thus, the third insulating film 20, the first single-crystal semiconductor film 19, the first insulating film 12, the second insulating film 14 and the second single-crystal semiconductor film 22 can be formed over the substrate 21 without using a high temperature heat treatment at a temperature of more than 600° C. (FIG. 5B).

Figure 5C:
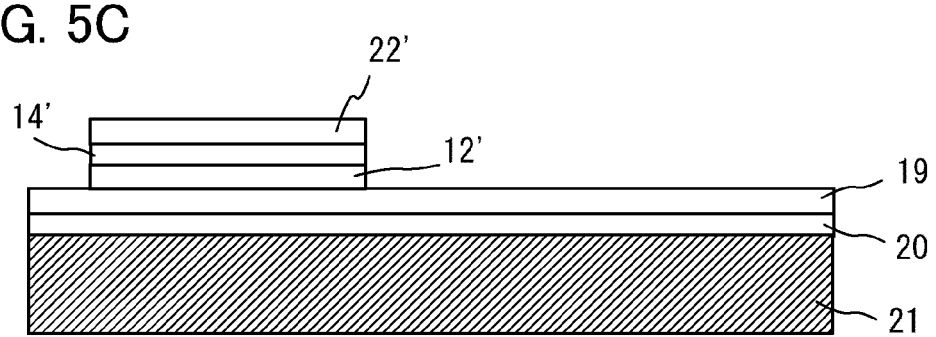

Next, an island-shaped second single-crystal semiconductor film 22' is formed by selectively removing the second single-crystal semiconductor film 22 by using a photolithography method or an etching method. Then, part of the first insulating film 12 and part of the second insulating film 14 are removed so that the first single-crystal semiconductor film 19 is exposed (FIG. 5C). An island-shaped first insulating film 12', an island-shaped second insulating film 14', and the island-shaped second single-crystal semiconductor film 22' are formed over the first single-crystal semiconductor film 19.

[Embodiment 2]

In consideration of the mobility of a transistor, it is preferable that a channel be formed using a single-crystal semiconductor film whose plane orientation be (100) in the case of an n-channel transistor, and it is preferable that a channel be formed using a single-crystal semiconductor film whose plane orientation be (110) in the case of a p-channel transistor. In the present invention, in the case where plane orientation of a main surface of the first single-crystal semiconductor substrate 11 is one of (100) and (110), and plane orientation of a main surface of the second single-crystal semiconductor substrate 13 is the other of (100) and (110), plane orientation of a main surface of the first single-crystal semiconductor film 19 can be one of (100) and (110), and plane orientation of a main surface of the second single-crystal semiconductor film 22 can be the other of (100) and (110). Then, an n-channel transistor and a p-channel transistor are formed using the first single-crystal semiconductor film 19 and the second single-crystal semiconductor film 22 so that an n-channel transistor and a p-channel transistor with high mobility are formed.

[Embodiment 3]

An n-channel transistor and a p-channel transistor are formed using the island-shaped second single-crystal semiconductor film 22' and the island-shaped first single-crystal semiconductor film 19' formed in Embodiment 1.

Figure 6A:
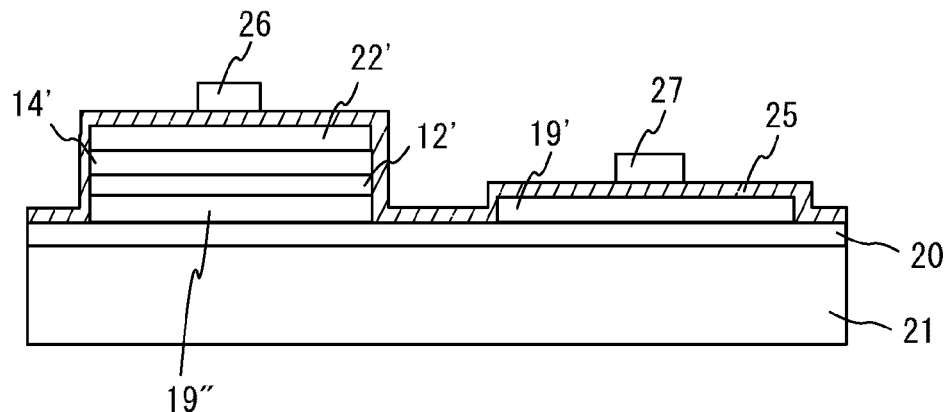
FIGS. 6A to 6C are views illustrating a manufacturing method of Embodiment 3.

The first single-crystal semiconductor film 19 is processed into the island-shaped first single-crystal semiconductor film 19' and an island-shaped first single-crystal semiconductor film 19" by using a photolithography method or an etching method. The island-shaped first insulating film 12', the island-shaped second insulating film 14', and the island-shaped second single-crystal semiconductor film 22' are formed over the island-shaped first single-crystal semiconductor film 19". A gate insulating film 25 is formed over the island-shaped first single-crystal semiconductor film 19' and the island-shaped second single-crystal semiconductor film 22'. A gate electrode 26 and a gate electrode 27 are formed over the gate insulating film 25 (FIG. 6A).

Figure 6B:
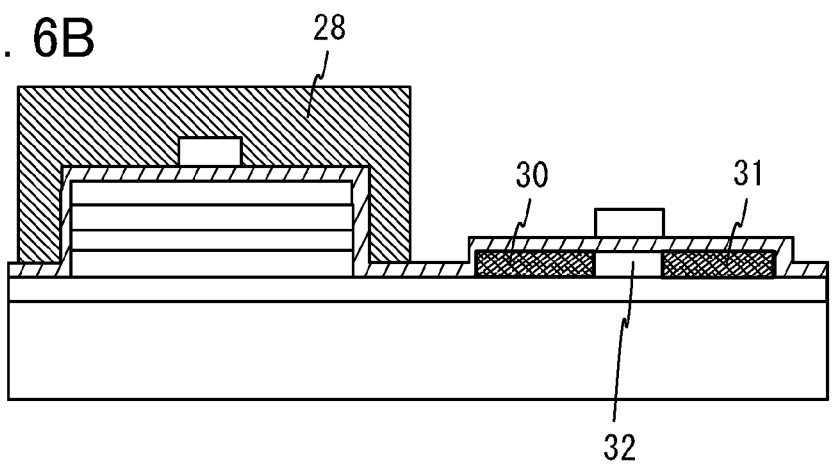

After the gate electrodes 26 and 27 are formed, the island-shaped second single-crystal semiconductor film 22', the gate insulating film 25, and the gate electrode 26 are covered with a resist mask 28 (FIG. 6B). An n-type impurity ion (phosphorus ion or arsenic ion) is added to the island-shaped first single-crystal semiconductor film 19' by an ion doping method or an ion implantation method with the use of the gate electrode 27 as a mask. N-type impurity regions 30 and 31 are formed in the island-shaped first single-crystal semiconductor film 19' in a self-aligned manner. The n-type impurity regions 30 and 31 function as a source and a drain, respectively. In the island-shaped first single-crystal semiconductor film 19', a region overlapping with the gate electrode 27 functions as a channel 32 (FIG. 6B).

Figure 6C:
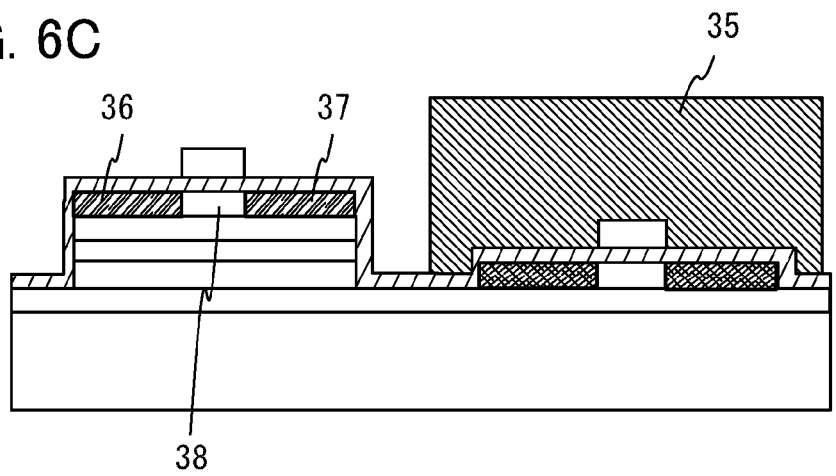

After the resist mask 28 is removed, the island-shaped first single-crystal semiconductor film 19', the gate insulating film 25 and the gate electrode 27 are covered with a resist mask 35 (FIG. 6C). A p-type impurity ion (boron ion) is added to the island-shaped second single-crystal semiconductor film 22' by an ion doping method or an ion implantation method with the use of the gate electrode 26 as a mask. P-type impurity regions 36 and 37 are formed in the island-shaped second single-crystal semiconductor film 22' in a self-aligned manner. The p-type impurity regions 36 and 37 function as a source and a drain, respectively. In the island-shaped second single-crystal silicon semiconductor 22', a region overlapping with the gate electrode 26 functions as a channel 38 (FIG. 6C). A method in which the n-type impurity regions 30 and 31 are formed and then the p-type impurity regions 36 and 37 are formed is described here; however, the p-type impurity regions 36 and 37 may be formed first. In addition, n-type impurity ion is added to the island-shaped first single-crystal semiconductor film 19' and the p-type impurity ion is added to the island-shaped second single-crystal semiconductor film 22'; however, the types of impurity ion may be exchanged.

Note that in the island-shaped first single-crystal semiconductor film 19' and the island-shaped second single-crystal semiconductor film 22', an LDD region or an off-set region is formed if necessary.

After the resist mask 35 is removed, heat treatment is performed at a temperature of 500° C. to 600° C. inclusive to activate the added impurity ions.

After the heat treatment, an insulating film 40 containing hydrogen is formed. Heat treatment is performed at a temperature of 250° C. to 500° C. inclusive for 30 minutes to 180 minutes, whereby hydrogen contained in the insulating film 40 is diffused in the island-shaped first single-crystal semiconductor film 19' and the island-shaped second single-crystal semiconductor film 22'. A film of silicon nitride or silicon nitride oxide formed by a plasma CVD method is used for the insulating film 40. The hydrogen terminates dangling bonds in the island-shaped first single-crystal semiconductor film 19' and the island-shaped second single-crystal semiconductor film 22'.

Figure 7:
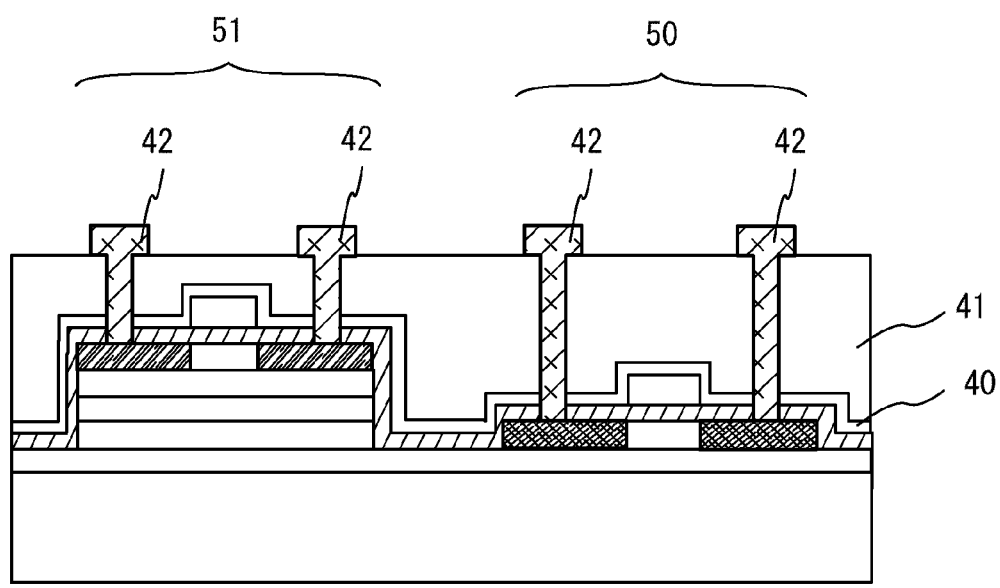
FIG. 7 is a view illustrating a manufacturing method of Embodiment 3.

An insulating film 41 is formed (FIG. 7). The insulating film 41 is a film selected from an inorganic insulating film such as a silicon oxide film, a borophosphosilicate glass (BPSG) film, or the like, or an organic resin film of polyimide, acrylic, or the like, or a stacked-layer film of the inorganic insulating film and the organic resin film. After contact holes are formed in the insulating film 41, wirings 42 are formed (FIG. 7). The wirings 42 serve as source electrodes and drain electrodes. The wirings 42 are formed of a conductive film with a three-layer structure in which a low-resistance metal film such as an aluminum film or an aluminum alloy film is interposed between barrier metal films. The barrier metal films are metal films of molybdenum, chromium, titanium, or the like.

Through the above steps, a semiconductor device including an n-channel transistor 50 and a p-channel transistor 51 can be formed without using a high temperature heat treatment. In addition, by combining the structure of Embodiment 2, a semiconductor device including the n-channel transistor 50 and the p-channel transistor 51 with high mobility can be formed.

[Embodiment 4]

Figure 8A:
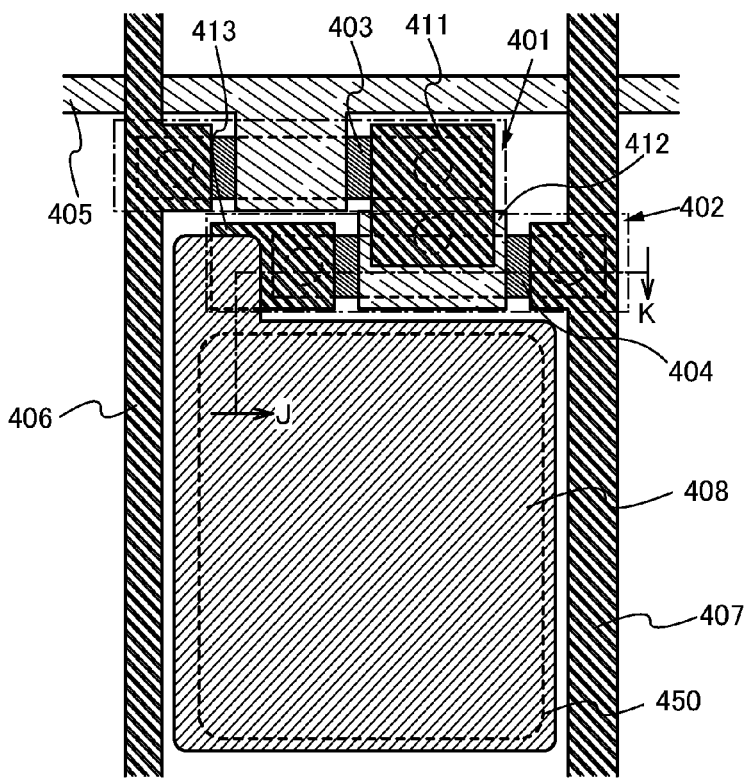
FIGS. 8A and 8B are views illustrating a manufacturing method of Embodiment 4.
Figure 8B:
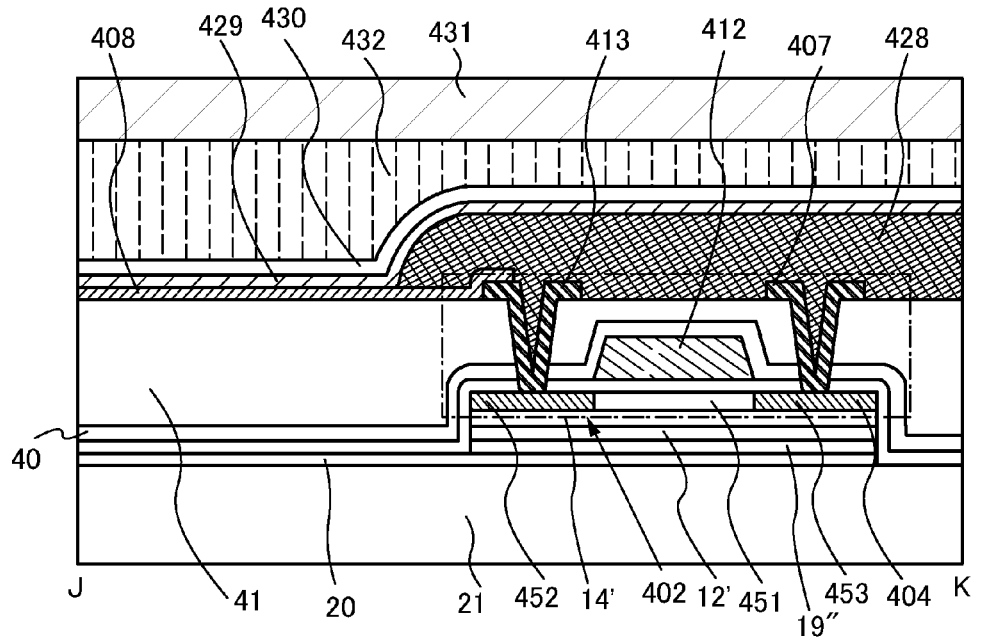

An electroluminescence device (hereinafter referred to as a light-emitting device) including a semiconductor device having an n-channel transistor and a p-channel transistor will be described (FIGS. 8A and 8B). FIG. 8A is a plan view of a pixel of the light-emitting device, and FIG. 8B is a cross-sectional view taken along a section line J-K in FIG. 8A.

A pixel region includes a selection transistor 401, a display control transistor 402, a scan line 405, a signal line 406, a current supply line 407, and a pixel electrode 408. Each pixel is provided with a light-emitting element having a structure in which a layer including an electroluminescence material (this layer is also referred to as an EL layer) is sandwiched between a pair of electrodes. One electrode of the light-emitting element is the pixel electrode 408. Further, in an island-shaped single-crystal semiconductor film 403, a channel, a source, and a drain of the selection transistor 401 are formed. In an island-shaped single-crystal semiconductor film 404, a channel 451, a source 453, and a drain 452 of the display control transistor 402 are formed. The island-shaped single-crystal semiconductor film 403 and the island-shaped single-crystal semiconductor film 404 correspond to the island-shaped second single-crystal semiconductor film 22' and the island-shaped first single-crystal semiconductor film 19' formed over the insulating substrate 21, respectively.

The selection transistor 401 is an n-channel transistor. A gate electrode is included in the scan line 405, one of a source electrode and a drain electrode is included in the signal line 406, and the other thereof is formed as an electrode 411.

The display control transistor 402 is a p-channel transistor. A gate electrode 412 is electrically connected to the electrode 411, one of a source electrode and a drain electrode is an electrode 413 which is electrically connected to the pixel electrode 408, and the other thereof is included in the current supply line 407.

The insulating films 40 and 41 are formed to cover the gate electrode 412. Over the insulating film 41, the signal line 406, the current supply line 407, the electrode 411, the electrode 413, and the like are formed. In addition, the pixel electrode 408 which is electrically connected to the electrode 413 is formed over the insulating film 41. The pixel electrode 408 is surrounded by a partition wall layer 428, which has an insulating property, at the periphery. In FIG. 8A, inside a portion 450 of the pixel electrode 408, which is surrounded by a dotted line, is a display portion. The partition wall layer 428 is provided outside the portion 450 surrounded by a dotted line of the pixel electrode 408. An EL layer 429 is formed over the pixel electrode 408, and a counter electrode 430 is formed over the EL layer 429. A counter substrate 431 is provided so as to face the insulating substrate 21, and the counter substrate 431 is fixed to the insulating substrate 21 with a resin layer 432.

Note that the structure described in this embodiment can be combined as appropriate with any structure described in the other embodiments in this specification.

[Embodiment 5]

Figure 9A:
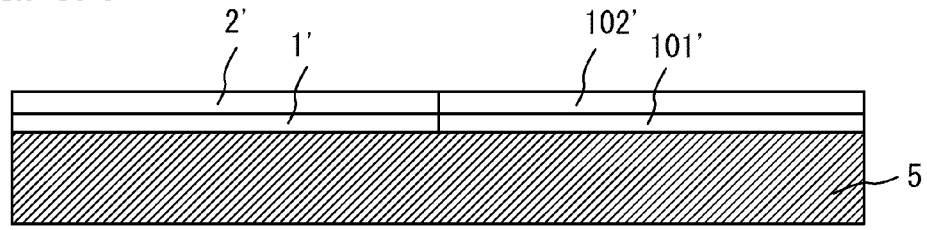
FIGS. 9A to 9C are views illustrating a manufacturing method of Embodiment 5.
Figure 9B:
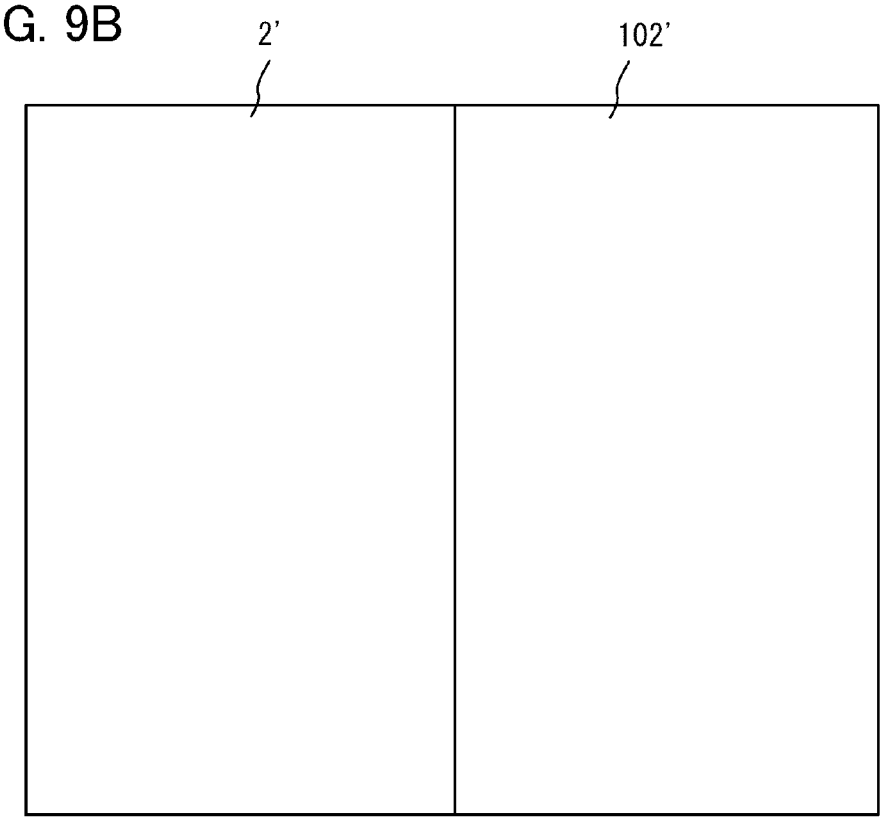
Figure 21A:
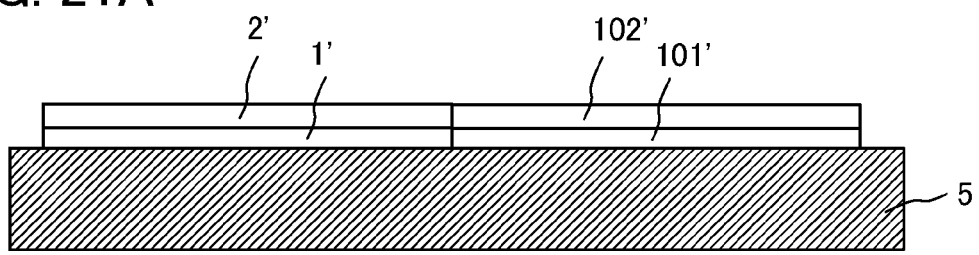
FIGS. 21A and 21B are views illustrating a manufacturing method of Embodiment 5.
Figure 21B:
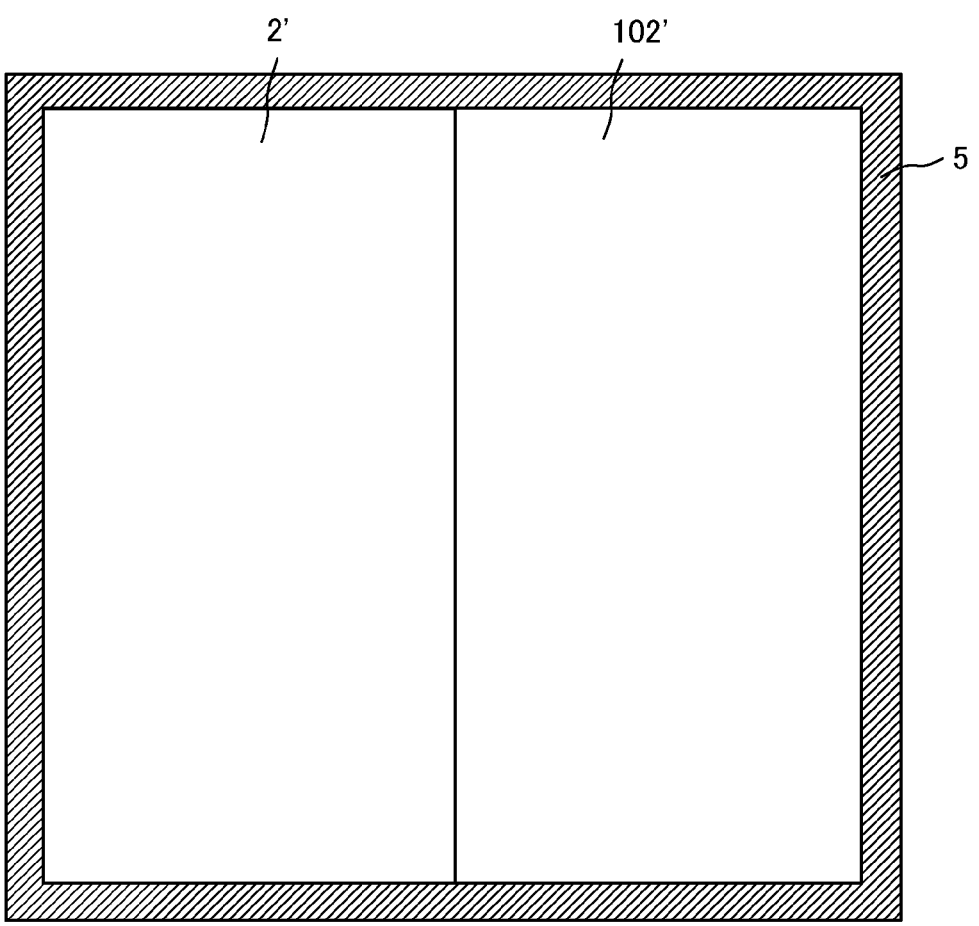

In Embodiment 5, a first single-crystal semiconductor film 1' and a second single-crystal semiconductor film 2', and a third single-crystal semiconductor film 101' and a fourth single-crystal semiconductor film 102' are formed over the insulating substrate 5 (FIG. 9A). FIG. 9B is a top view of FIG. 9A. Specifically, a manufacturing method of a semiconductor device is disclosed. In the manufacturing method: a first embrittlement layer is formed by doping a first single-crystal semiconductor substrate with first ions; a second embrittlement layer is formed by doping a second single-crystal semiconductor substrate with second ions; a third embrittlement layer is formed by doping a third single-crystal semiconductor substrate with the first ions; a fourth embrittlement layer is formed by doping a fourth single-crystal semiconductor substrate with the second ions; the first single-crystal semiconductor substrate and the second single-crystal semiconductor substrate are bonded to each other; the third single-crystal semiconductor substrate and the fourth single-crystal semiconductor substrate are bonded to each other; a first single-crystal semiconductor film is formed over the second single-crystal semiconductor substrate by separating part of the first single-crystal semiconductor substrate along the first embrittlement layer by a first heat treatment; a third single-crystal semiconductor film is formed over the fourth single-crystal semiconductor substrate by separating part of the third single-crystal semiconductor substrate along the third embrittlement layer by a second heat treatment; an insulating substrate is bonded over the first single-crystal semiconductor film and the third single-crystal semiconductor film; and the first single-crystal semiconductor film and a second single-crystal semiconductor film are formed over the insulating substrate by separating part of the second single-crystal semiconductor substrate along the second embrittlement layer by a third heat treatment and the third single-crystal semiconductor film and a fourth single-crystal semiconductor film are formed over the insulating substrate by separating part of the fourth single-crystal semiconductor substrate along the fourth embrittlement layer by the third heat treatment. In the manufacturing method, the dose of the first ions is higher than that of the second ions and the temperatures of the first and the second heat treatments are lower than that of the third heat treatment. Note that although a single-crystal semiconductor film is formed over an entire top surface of the insulating substrate 5 in FIG. 9B, the single-crystal semiconductor film is not necessarily formed over the entire top surface of the insulating substrate 5. For example, a single-crystal semiconductor film may be formed only over a central portion of the insulating substrate 5 (FIGS. 21A and 21B).

Figure 9C:
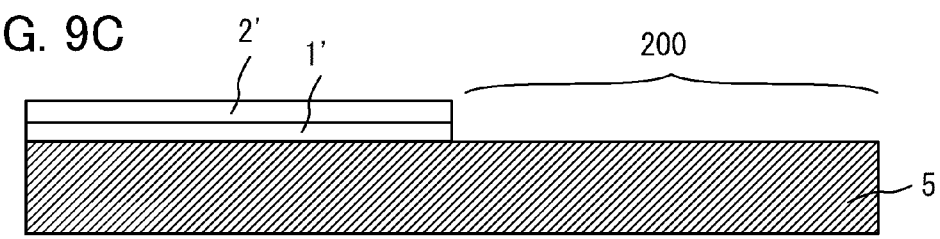

In the case where the size and area of the insulating substrate 5 is larger than those of the first single-crystal semiconductor substrate 1 and the second single-crystal semiconductor substrate 2, a portion 200 in which the first single-crystal semiconductor film 1' and the second single-crystal semiconductor film 2' are not formed is formed over the insulating substrate 5 (FIG. 9C). Therefore, a single-crystal semiconductor film is formed in the portion 200 with the use of a single-crystal semiconductor substrate. In Embodiment 5, the third single-crystal semiconductor film 101' and the fourth single-crystal semiconductor film 102' are formed using the third single-crystal semiconductor substrate 101 and the fourth single-crystal semiconductor substrate 102.

Figure 1B:
Figure 1C:
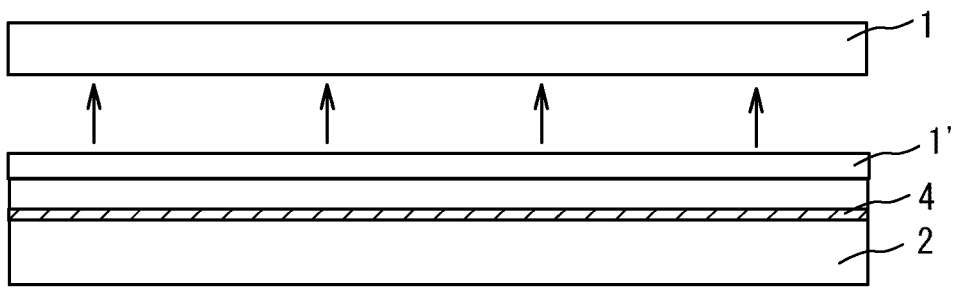
Figure 2A:
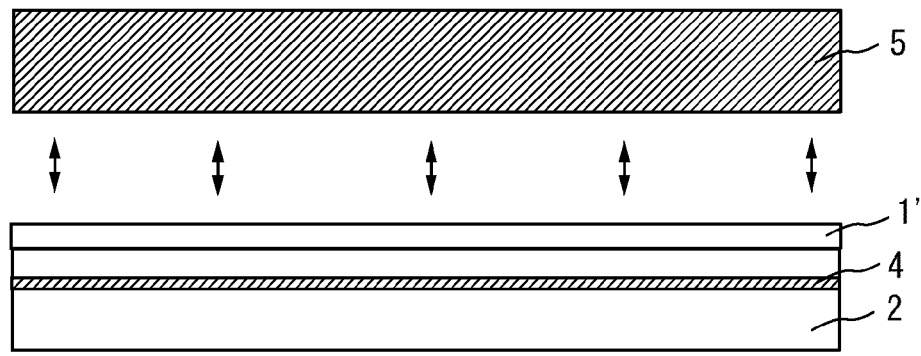
FIGS. 2A to 2C are views illustrating one embodiment of the present invention.
Figure 2B:
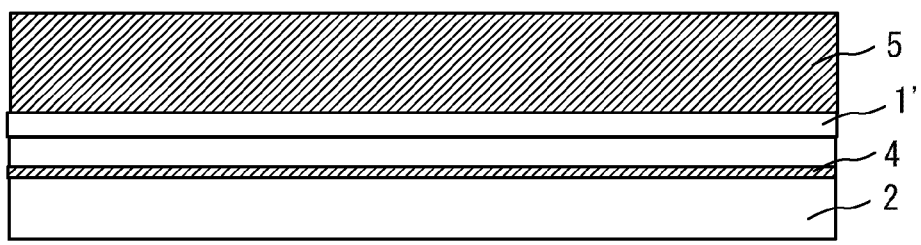
Figure 2C:
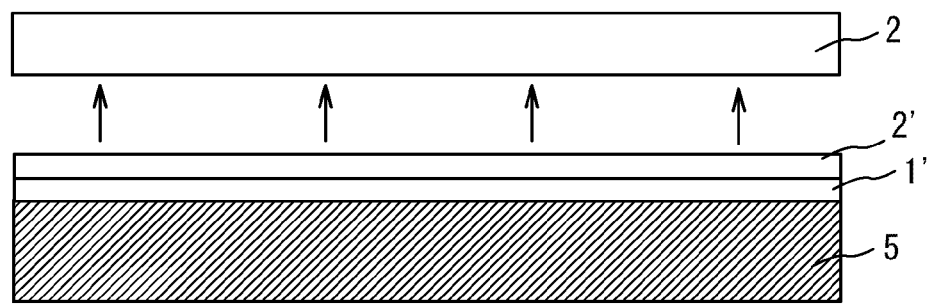

The first embrittlement layer 3 is formed by doping the first single-crystal semiconductor substrate 1 with the first ions and the second embrittlement layer 4 is formed by doping the second single-crystal semiconductor substrate 2 with the second ions (FIG. 1A). The dose of the first ions is higher than the dose of the second ions. The second ions may be the same as the first ions. After the first single-crystal semiconductor substrate 1 and the second single-crystal semiconductor substrate 2 are bonded to each other (FIG. 1B), the first single-crystal semiconductor film 1' is formed by selectively separating part of the first single-crystal semiconductor substrate 1 along the first embrittlement layer 3 by the first heat treatment (FIG. 1C). Note that the second single-crystal semiconductor substrate 2 is not separated. Alignment at the time of bonding is facilitated by using the first single-crystal semiconductor substrate 1 and the second single-crystal semiconductor substrate 2 having the same size.

Figure 10A:
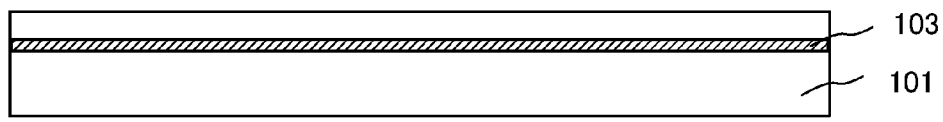
FIGS. 10A to 10C are views illustrating a manufacturing method of Embodiment 5.

The third embrittlement layer 103 is formed by doping the third single-crystal semiconductor substrate 101 with the first ions and the fourth embrittlement layer 104 is formed by doping the fourth single-crystal semiconductor substrate 102 with the second ions (FIG. 10A). The dose of the first ions is higher than the dose of the second ions. It is preferable that the dose of the first ions with which the third single-crystal semiconductor substrate 101 is doped be the same as that of the first ions with which the first single-crystal semiconductor substrate 1 is doped. In addition, it is preferable that the dose of the second ions with which the fourth single-crystal semiconductor substrate 102 is doped be the same as that of the second ions with which the second single-crystal semiconductor substrate 2 is doped.

Figure 10B:
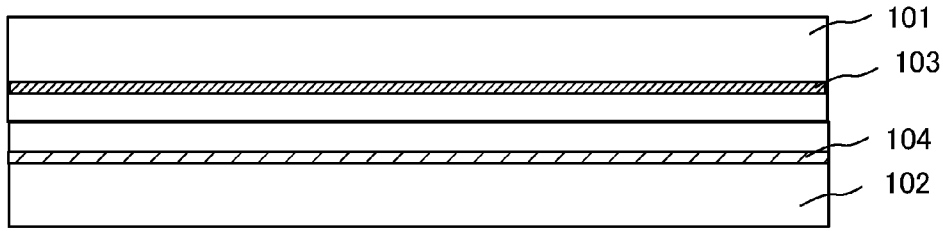
Figure 10C:
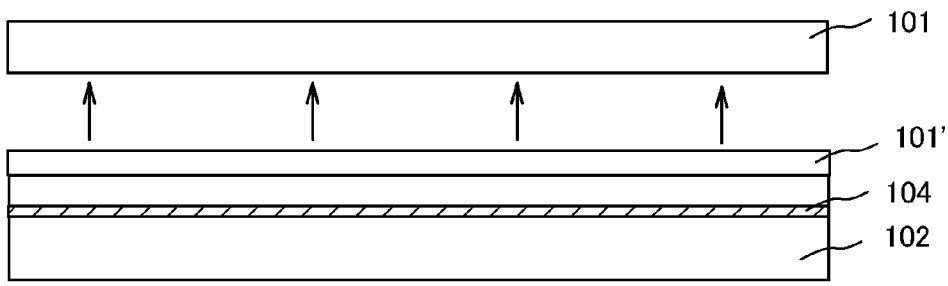

The third single-crystal semiconductor substrate 101 and the fourth single-crystal semiconductor substrate 102 are bonded to each other (FIG. 10B). Then, the third single-crystal semiconductor film 101' is formed by selectively separating part of the third single-crystal semiconductor substrate 101 along the third embrittlement layer 103 by the second heat treatment (FIG. 10C). It is preferable that the temperature of the first heat treatment and that of the second heat treatment be the same. The first heat treatment and the second heat treatment may be performed at the same time in the same heating furnace. Note that the fourth single-crystal semiconductor substrate 102 is not separated. In addition, alignment at the time of bonding is facilitated by using the third single-crystal semiconductor substrate 101 and the fourth single-crystal semiconductor substrate 102 having the same size.

Figure 11A:
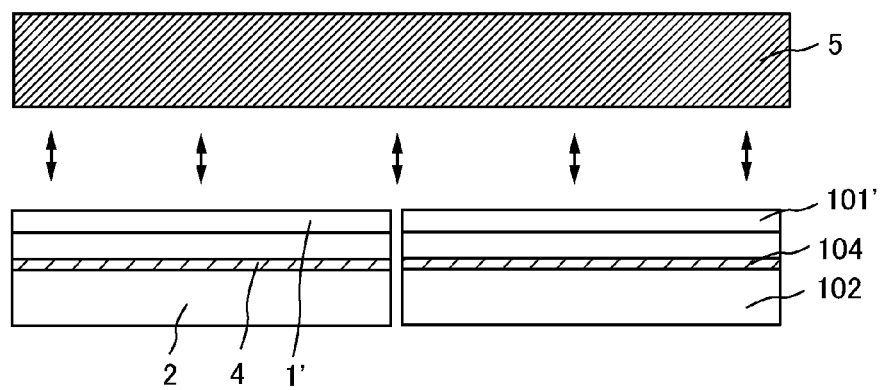
FIGS. 11A to 11C are views illustrating a manufacturing method of Embodiment 5.
Figure 11B:
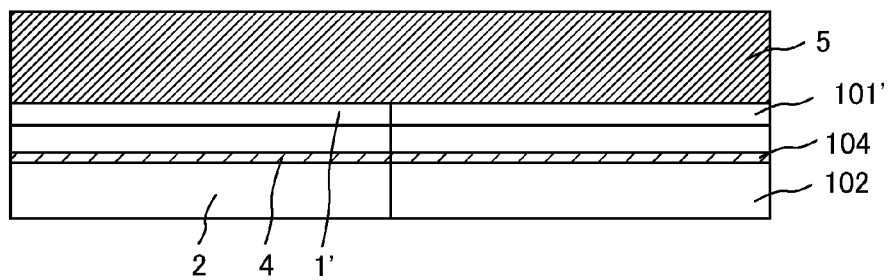

The first single-crystal semiconductor film 1' and the insulating substrate 5 are bonded to each other and the third single-crystal semiconductor film 101' and the insulating substrate 5 are bonded to each other (FIGS. 11A and 11B). At this time, it is preferable that a side surface of the first single-crystal semiconductor film 1' and a side surface of the third single-crystal semiconductor film 101' be tightly attached to each other without any space therebetween. Similarly, it is preferable that a side surface of the second single-crystal semiconductor substrate 2 and a side surface of the fourth single-crystal semiconductor substrate 102 be tightly attached to each other without any space therebetween.

Figure 11C:
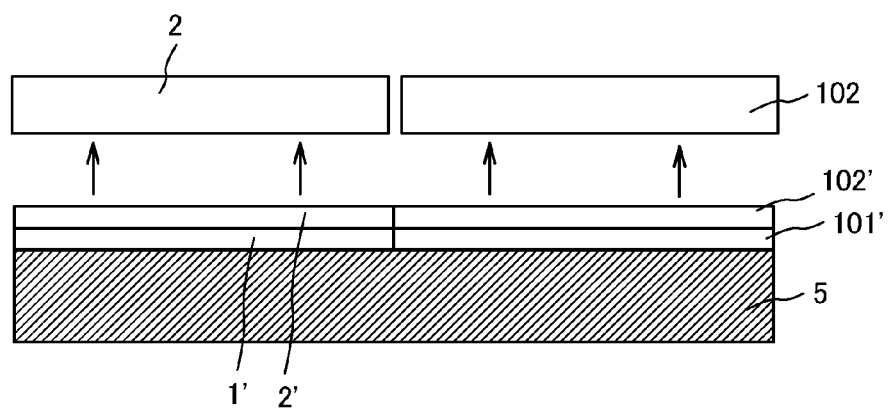

The second single-crystal semiconductor film 2' is formed by separating part of the second single-crystal semiconductor substrate 2 along the second embrittlement layer 4 by the third heat treatment, and the fourth single-crystal semiconductor film 102' is formed by separating part of the fourth single-crystal semiconductor substrate 102 along the fourth embrittlement layer 104 by the third heat treatment (FIG. 11C). The temperatures of the first heat treatment and the second heat treatment are lower than that of the third heat treatment. By making the dose of the first ions higher than that of the second ions, the temperatures of the first heat treatment and the second heat treatment can be lower than that of the third heat treatment. Then, the first single-crystal semiconductor substrate 1 and the third single-crystal semiconductor substrate 101 can be selectively separated by the first heat treatment and the second heat treatment.

Note that the structure in FIGS. 9A and 9B can be obtained also by the following method. In the method: the first single-crystal semiconductor substrate 1 and the third single-crystal semiconductor substrate 101 are bonded to the insulating substrate 5; the first single-crystal semiconductor film 1' is formed by separating part of the first single-crystal semiconductor substrate 1 and the third single-crystal semiconductor film 101' is formed by separating part of the third single-crystal semiconductor substrate 101 by heat treatment; and afterwards the second single-crystal semiconductor substrate 2 is bonded over the first single-crystal semiconductor film 1' and the fourth single-crystal semiconductor substrate 102 is bonded over the third single-crystal semiconductor film 101'; and the second single-crystal semiconductor film 2' is formed by separating part of the second single-crystal semiconductor substrate 2 and the fourth single-crystal semiconductor film 102' is formed by separating part of the fourth single-crystal semiconductor substrate 102 by heat treatment. However, in the case where the above method is used, it is difficult to perform alignment at the time of bonding the second single-crystal semiconductor substrate 2 over the first single-crystal semiconductor film 1' and at the time of bonding the fourth single-crystal semiconductor substrate 102 over the third single-crystal semiconductor film 101'.

Figure 12A:
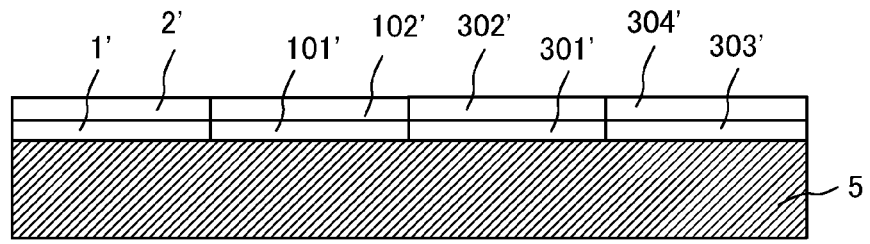
FIGS. 12A to 12C are views illustrating a manufacturing method of Embodiment 5.
Figure 12B:
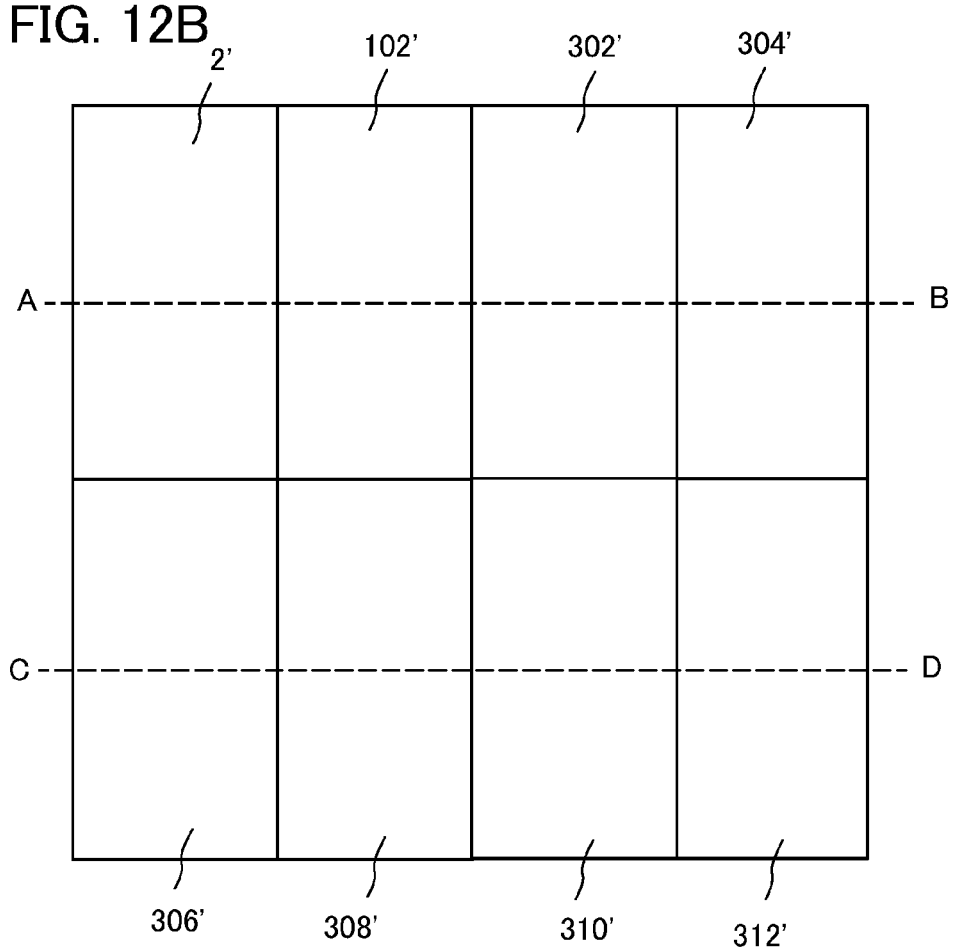
Figure 12C:
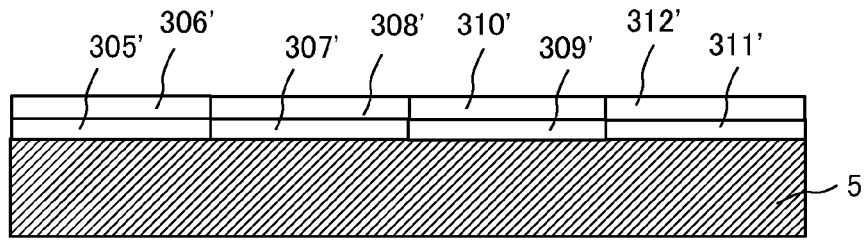

The first single-crystal semiconductor film 1', the second single-crystal semiconductor film 2', the third single-crystal semiconductor film 101', and the fourth single-crystal semiconductor film 102' are formed over the insulating substrate 5 up to here. Further, a plurality of single-crystal semiconductor films may be formed using a plurality of single-crystal semiconductor substrates. For example, a fifth single-crystal semiconductor film 301', a sixth single-crystal semiconductor film 302', a seventh single-crystal semiconductor film 303', an eighth single-crystal semiconductor film 304', a ninth single-crystal semiconductor film 305', a tenth single-crystal semiconductor film 306', an eleventh single-crystal semiconductor film 307', a twelfth single-crystal semiconductor film 308', a thirteenth single-crystal semiconductor film 309', a fourteenth single-crystal semiconductor film 310', a fifteenth single-crystal semiconductor film 311', and a sixteenth single-crystal semiconductor film 312' may be formed (FIGS. 12A to 12C). FIG. 12A is a cross-sectional view taken along a dotted line A-B in FIG. 12B, and FIG. 12C is a cross-sectional view taken along a dotted line C-D in FIG. 12B. The plurality of single-crystal semiconductor films can be formed to be arranged in a tile pattern over the insulating substrate 5.

In this Embodiment, kind of ions, dose, temperature of heat treatment, or the like are the same as those described in Embodiment 1.

[Embodiment 6]

In Embodiment 6, a manufacturing method of a semiconductor device in which Embodiment 1 is applied to Embodiment 5 is described. Specifically, a manufacturing method of a semiconductor device is disclosed. In the manufacturing method: a first insulating film is formed over a surface of a first single-crystal semiconductor substrate; a second insulating film is formed over a surface of a second single-crystal semiconductor substrate; a third insulating film is formed over a surface of a third single-crystal semiconductor substrate; a fourth insulating film is formed over a surface of a fourth single-crystal semiconductor substrate; a first embrittlement layer is formed by doping the first single-crystal semiconductor substrate with first ions through the first insulating film; a second embrittlement layer is formed by doping the second single-crystal semiconductor substrate with second ions through the second insulating film; a third embrittlement layer is formed by doping the third single-crystal semiconductor substrate with the first ions through the third insulating film; a fourth embrittlement layer is formed by doping the fourth single-crystal semiconductor substrate with the second ions through the fourth insulating film; the first insulating film and the second insulating film are bonded to each other; the third insulating film and the fourth insulating film are bonded to each other; a first single-crystal semiconductor film is formed over the second single-crystal semiconductor substrate with the first insulating film and the second insulating film interposed therebetween by separating part of the first single-crystal semiconductor substrate along the first embrittlement layer by a first heat treatment; a third single-crystal semiconductor film is formed over the fourth single-crystal semiconductor substrate with the third insulating film and the fourth insulating film interposed therebetween by separating part of the third single-crystal semiconductor substrate along the third embrittlement layer by the first heat treatment; a fifth insulating film is formed over the first single-crystal semiconductor film; a sixth insulating film is formed over the third single-crystal semiconductor film; the fifth insulating film and an insulating substrate are bonded to each other; the sixth insulating film and the insulating substrate are bonded to each other; a second single-crystal semiconductor film is formed over the insulating substrate with the fifth insulating film, the first single-crystal semiconductor film, the second insulating film and the first insulating film interposed therebetween by separating part of the second single-crystal semiconductor substrate along the second embrittlement layer by a second heat treatment; and a fourth single-crystal semiconductor film is formed over the insulating substrate with the sixth insulating film, the third single-crystal semiconductor film, the fourth insulating film and the third insulating film interposed therebetween by separating part of the fourth single-crystal semiconductor substrate along the fourth embrittlement layer by the second heat treatment. In the manufacturing method, the dose of the first ions is higher than that of the second ions and the temperature of the first heat treatment is lower than that of the second heat treatment.

Figure 13A:
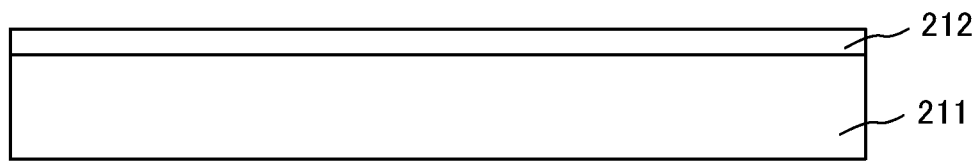
FIGS. 13A and 13B are views illustrating a manufacturing method of Embodiment 6.
Figure 13A:
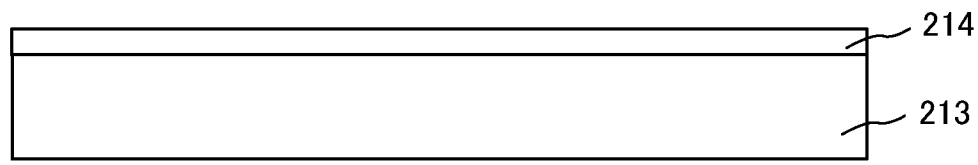
Figure 13B:
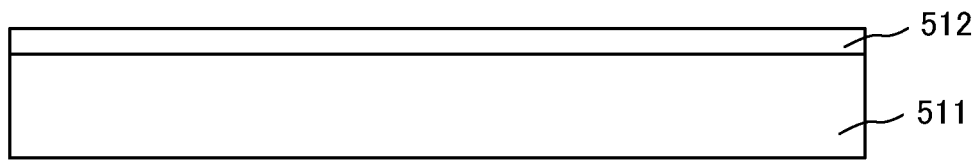
Figure 13B:
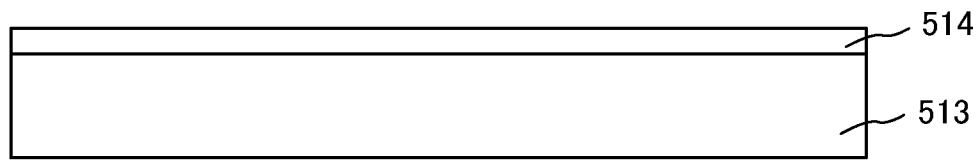

A first insulating film 212 is formed over a first single-crystal semiconductor substrate 211. A second insulating film 214 is formed over a second single-crystal semiconductor substrate 213 (FIG. 13A). A third insulating film 512 is formed over a third single-crystal semiconductor substrate 511. A fourth insulating film 514 is formed over a fourth single-crystal semiconductor substrate 513 (FIG. 13B). The first single-crystal semiconductor substrate 211, the second single-crystal semiconductor substrate 213, the third single-crystal semiconductor substrate 511, and the fourth single-crystal semiconductor substrate 513 are the same as the first single-crystal semiconductor substrate 11 and the second single-crystal semiconductor substrate 13 described in Embodiment 1. The first insulating film 212, the second insulating film 214, the third insulating film 512, and the fourth insulating film 514 are the same as the first insulating film 12 and the second insulating film 14 described in Embodiment 1.

Figure 14A:
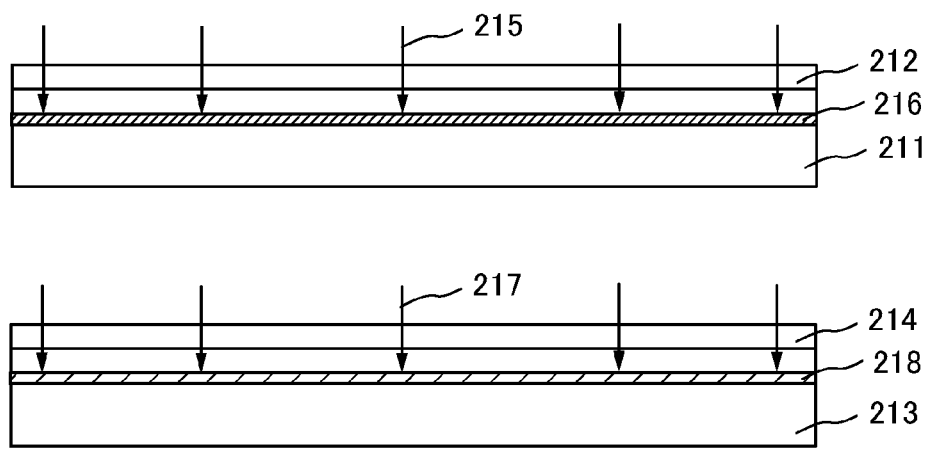
FIGS. 14A and 14B are views illustrating a manufacturing method of Embodiment 6.
Figure 14B:
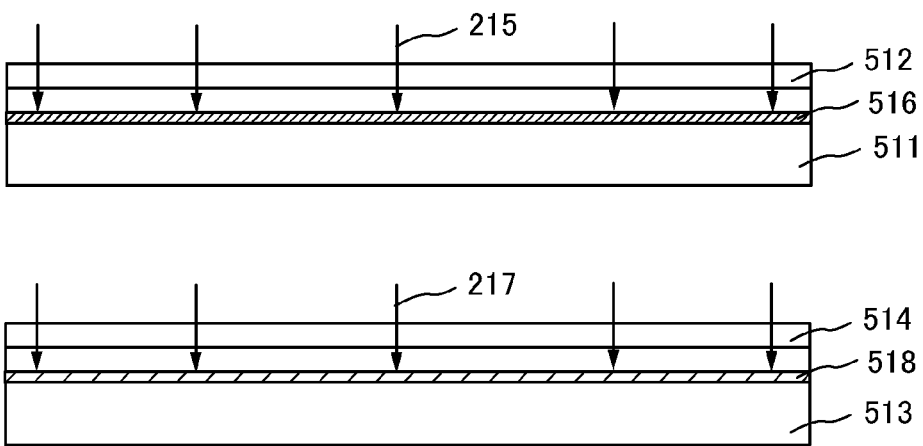

A first embrittlement layer 216 is formed by doping the first single-crystal semiconductor substrate 211 with a first ion 215 through the first insulating film 212. Meanwhile, a second embrittlement layer 218 is formed by doping the second single-crystal semiconductor substrate 213 with a second ion 217 through the second insulating film 214 (FIG. 14A). A third embrittlement layer 516 is formed by doping the third single-crystal semiconductor substrate 511 with the first ion 215 through the third insulating film 512. On the other hand, a fourth embrittlement layer 518 is formed by doping the fourth single-crystal semiconductor substrate 513 with the second ion 217 through the fourth insulating film 514 (FIG. 14B).

The first ion 215 and the second ion 217 are ions (such as $H^+$, $H_2^+$, or $H_3^+$) which are generated from, for example, hydrogen ($H_2$) gas. Doping may be performed with ions generated from helium (He) gas simultaneously with the above ions. The first ion 215 and the second ion 217 may be the same kind of ions. Without limitation to the hydrogen ($H_2$) gas, gas containing a hydrogen atom (for example, $PH_3$ or $B_2H_6$,) may be used.

The dose of the first ion 215 is $2.5 \times 10^{16}$ cm$^{-2}$ to $2.7 \times 10^{16}$ cm$^{-2}$; the dose is $2.6 \times 10^{16}$ cm$^{-2}$ for example. On the other hand, the dose of the second ion 217 is $1.9 \times 10^{16}$ cm$^{-2}$ to $2.1 \times 10^{16}$ cm$^{-2}$; the dose is $2.0 \times 10^{16}$ cm$^{-2}$ for example. Difference in dose between the first ion 215 and the second ion 217 may be equal to or more than $0.6 \times 10^{16}$ cm$^{-2}$.

Accelerating voltages of the first ion 215 and the second ion 217 are adjusted so that the first embrittlement layer 216, the second embrittlement layer 218, the third embrittlement layer 516 and the fourth embrittlement layer 518 are formed at a depth of greater than or equal to 50 nm and less than or equal to 200 nm from surfaces of the first single-crystal semiconductor substrate 211, the second single-crystal semiconductor substrate 213, the third single-crystal semiconductor substrate 511, and the fourth single-crystal semiconductor substrate 513, respectively. The accelerating voltage of the first ion 215 and that of the second ion 217 may be the same.

Figure 15A:
FIGS. 15A to 15D are views illustrating a manufacturing method of Embodiment 6.
Figure 15B:
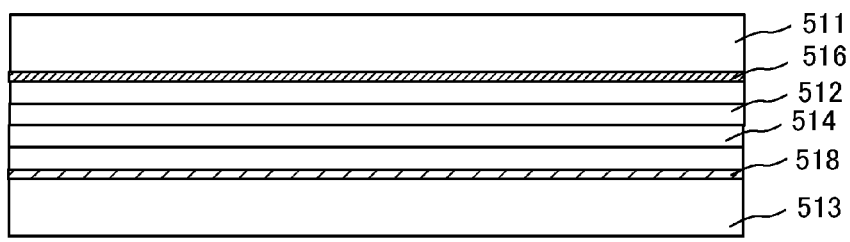

The first single-crystal semiconductor substrate 211 and the second single-crystal semiconductor substrate 213 are bonded to each other so that the first insulating film 212 and the second insulating film 214 face each other (FIG. 15A). The first insulating film 212 and the second insulating film 214 are firmly attached to each other. In addition, the third single-crystal semiconductor substrate 511 and the fourth single-crystal semiconductor substrate 513 are bonded to each other so that the third insulating film 512 and the fourth insulating film 514 face each other (FIG. 15B). The third insulating film 512 and the fourth insulating film 514 are firmly attached to each other.

Figure 15C:
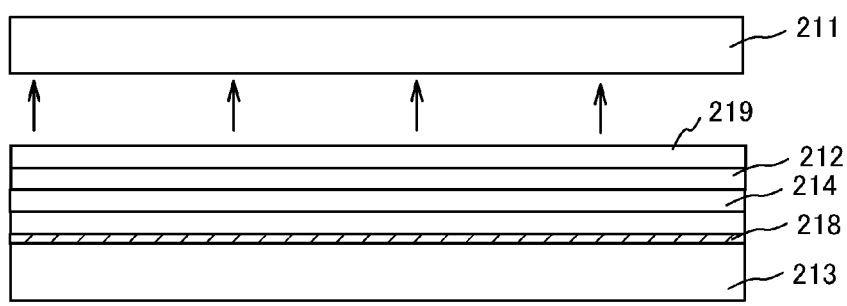
Figure 15D:
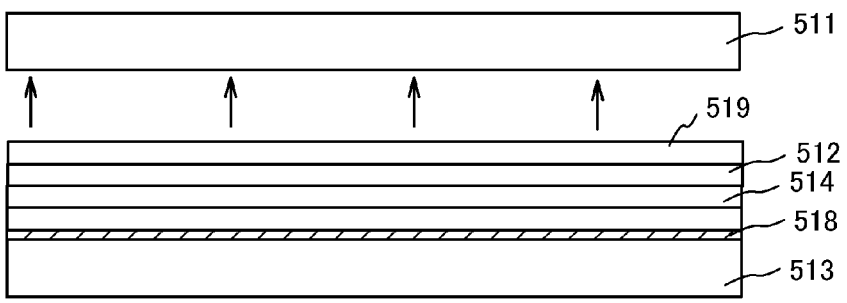

The first heat treatment is performed at a temperature of 470° C. to 480° C. inclusive. For example, the treatment time is about 0.5 minute to 300 minutes. Separation of part of the first single-crystal semiconductor substrate 211 can be caused along the first embrittlement layer 216 and a first single-crystal semiconductor film 219 which is separated from the first single-crystal semiconductor substrate 211 is formed over the second single-crystal semiconductor substrate 213 (FIG. 15C). On the other hand, separation of part of the third single-crystal semiconductor substrate 511 can be caused along the third embrittlement layer 516 and a third single-crystal semiconductor film 519 which is separated from the third single-crystal semiconductor substrate 511 is formed over the fourth single-crystal semiconductor substrate 513 (FIG. 15D).

When the surfaces of the first single-crystal semiconductor film 219 and the third single-crystal semiconductor film 519 are uneven, CMP, laser annealing, RTA, flash lamp annealing, or the like may be performed.

Figure 16A:
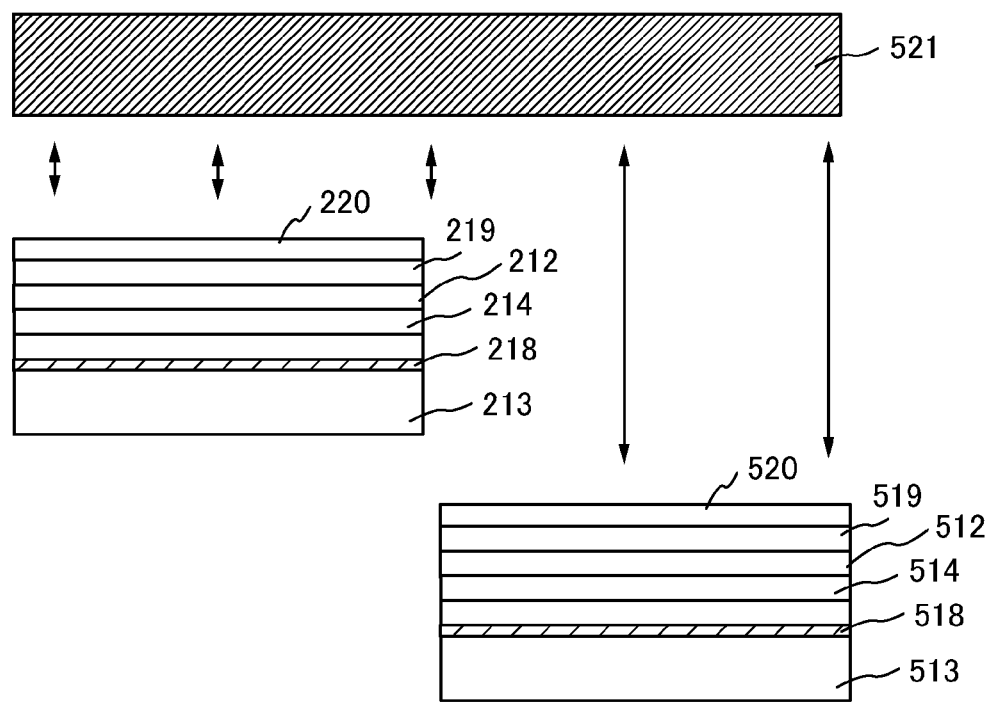
FIGS. 16A and 16B are views illustrating a manufacturing method of Embodiment 6.

A fifth insulating film 220 is formed over the first single-crystal semiconductor film 219 (FIG. 16A). A sixth insulating film 520 is formed over the third single-crystal semiconductor film 519 (FIG. 16A). The fifth insulating film 220 and the sixth insulating film 520 are the same as the third insulating film 20 described in Embodiment 1.

Figure 16B:
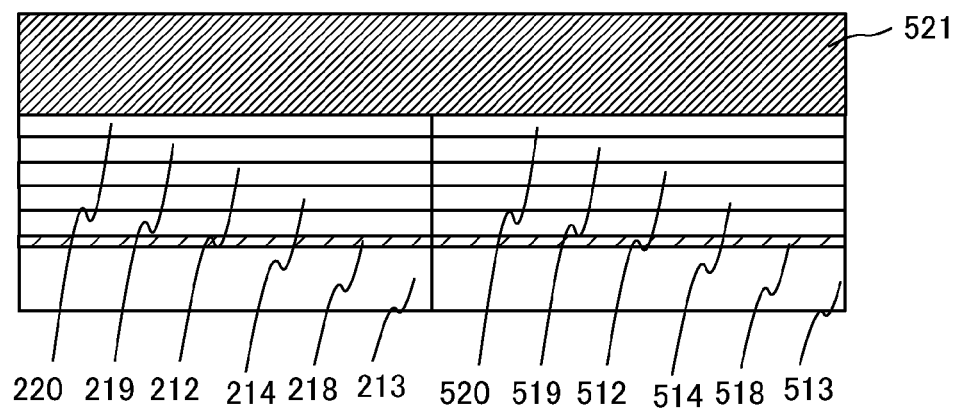

The fifth insulating film 220 and an insulating substrate 521 which is to be a base substrate and formed using a glass substrate or the like are bonded to each other. The sixth insulating film 520 and the insulating substrate 521 are bonded to each other (FIGS. 16A and 16B). The sixth insulating film 520 and the insulating substrate 521 are firmly attached to each other.

Figure 17A:
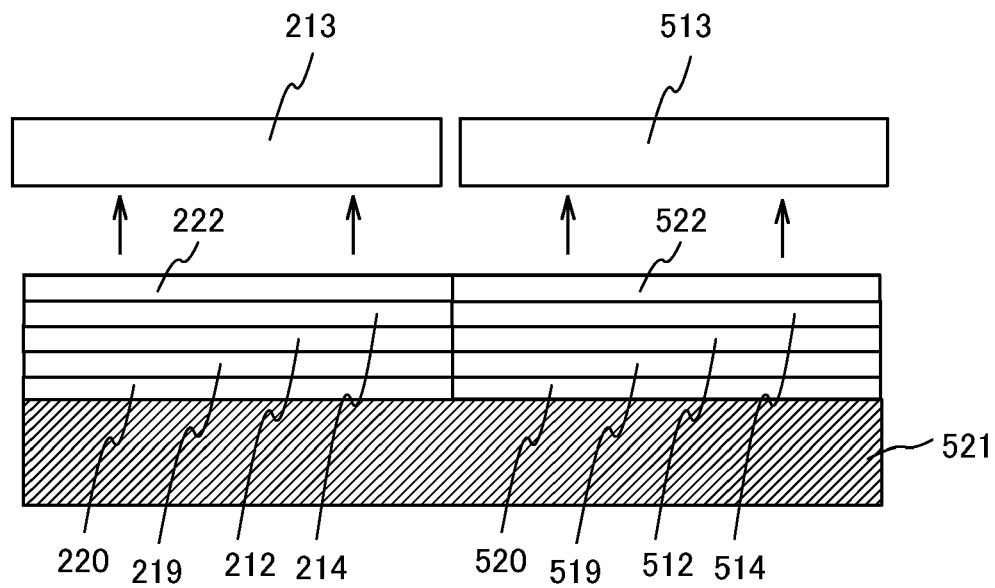
FIGS. 17A and 17B are views illustrating a manufacturing method of Embodiment 6.

The second heat treatment is performed at a temperature of 490° C. to 600° C. inclusive. For example, the treatment time is about 0.5 minute to 300 minutes. As a result, separation of part of the second single-crystal semiconductor substrate 213 can be caused along the second embrittlement layer 218 so that a second single-crystal semiconductor film 222 is formed, and separation of part of the fourth single-crystal semiconductor substrate 513 can be caused along the fourth embrittlement layer 518 so that a fourth single-crystal semiconductor film 522 is formed (FIG. 17A). Difference in temperature between the first heat treatment and the second heat treatment may be equal to or more than 20° C.

When the surfaces of the second single-crystal semiconductor film 222 and the fourth single-crystal semiconductor film 522 are uneven, CMP, laser annealing, RTA, flash lamp annealing, or the like may be performed.

Thus, the fifth insulating film 220, the first single-crystal semiconductor film 219, the first insulating film 212, the second insulating film 214 and the second single-crystal semiconductor film 222; and the sixth insulating film 520, the third single-crystal semiconductor film 519, the third insulating film 512, the fourth insulating film 514 and the fourth single-crystal semiconductor film 522 can be formed over the insulating substrate 521 without using a high temperature heat treatment at a temperature of more than 600° C.

Figure 17B:
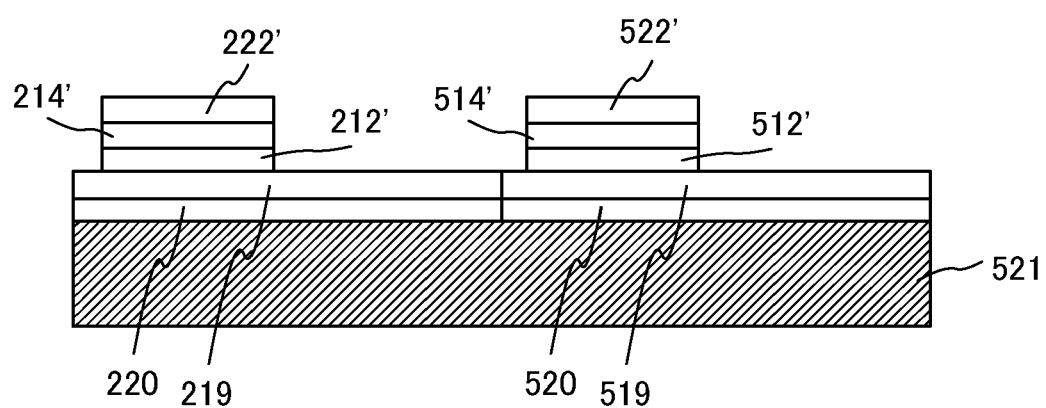
Figure 18A:
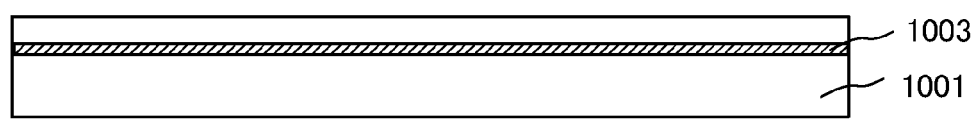
FIGS. 18A and 18B are views illustrating an experiment.
Figure 18A:
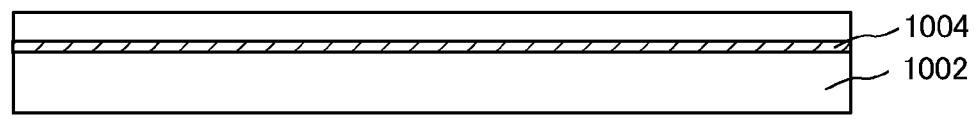
Figure 18B:
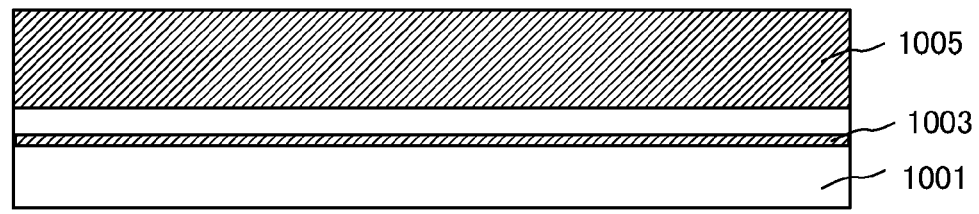
Figure 18B:
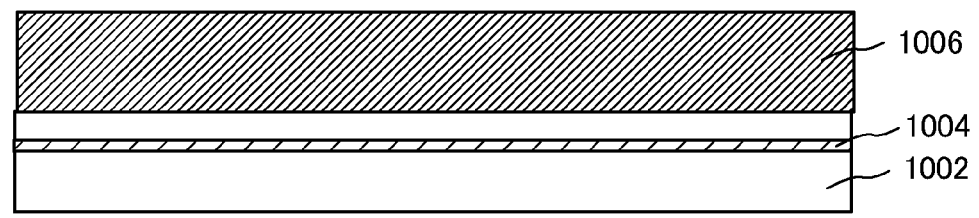
Figure 19:
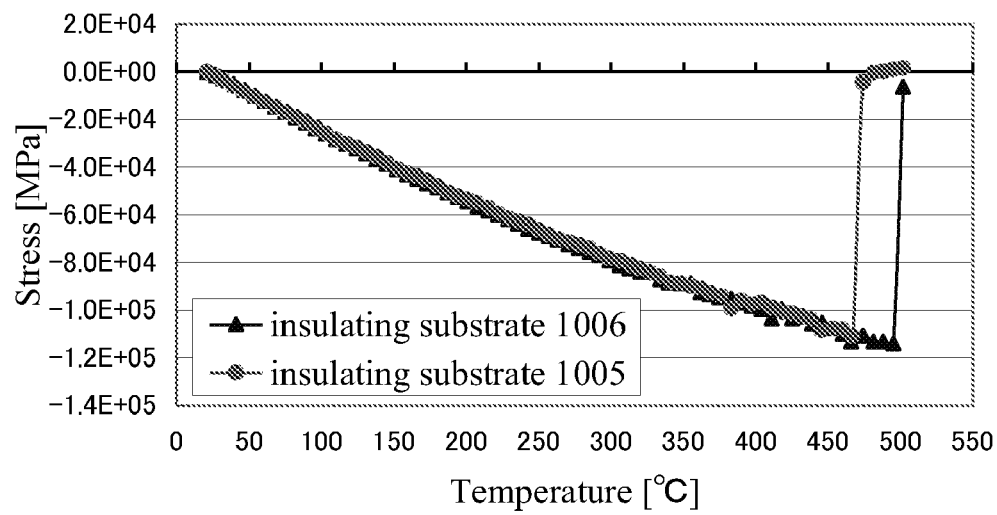
FIG. 19 is a graph showing a relation between stress of a substrate and temperature.
Figure 20:
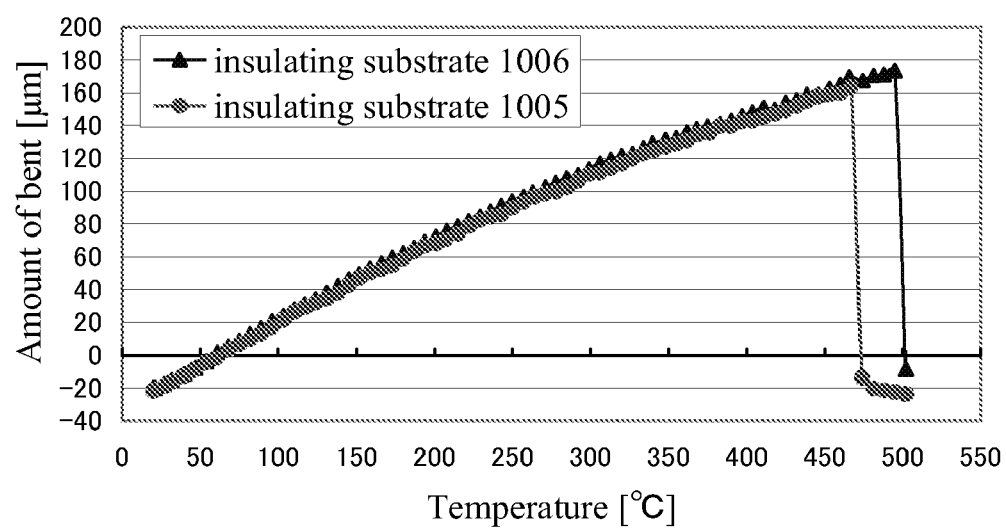
FIG. 20 is a graph showing a relation between the amount of bent of a substrate and temperature.

Next, by using a photolithography method or an etching method, an island-shaped second single-crystal semiconductor film 222' is formed by selectively removing the second single-crystal semiconductor film 222, and an island-shaped fourth single-crystal semiconductor film 522' is formed by selectively removing the fourth single-crystal semiconductor film 522. Then, part of the first insulating film 212 and part of the second insulating film 214 are removed so that the first single-crystal semiconductor film 219 is exposed, and part of the third insulating film 512 and part of the fourth insulating film 514 are removed so that the third single-crystal semiconductor film 519 is exposed. An island-shaped first insulating film 212', an island-shaped second insulating film 214', and the island-shaped second single-crystal semiconductor film 222' are formed over the first single-crystal semiconductor film 219, and an island-shaped third insulating film 512', an island-shaped fourth insulating film 514', and the island-shaped fourth single-crystal semiconductor film 522' are formed over the third single-crystal semiconductor film 519 (FIG. 17B).

This application is based on Japanese Patent Application serial no. 2009-237928 with Japan Patent Office on Oct., 15, 2009, the entire contents of which are hereby incorporated by reference.

What is claimed is:

1. A method for manufacturing a semiconductor device, comprising the steps of:

forming a first insulating film over a surface of a first single-crystal semiconductor substrate;

forming a second insulating film over a surface of a second single-crystal semiconductor substrate;

forming a first embrittlement layer in the first single-crystal semiconductor substrate by a first ion doping through the first insulating film;

forming a second embrittlement layer in the second single-crystal semiconductor substrate by a second ion doping through the second insulating film;

bonding the first insulating film and the second insulating film to each other;

forming a first single-crystal semiconductor film over the second single-crystal semiconductor substrate with the first insulating film and the second insulating film interposed between the first single-crystal semiconductor film and the second single-crystal semiconductor substrate by separating part of the first single-crystal semiconductor substrate along the first embrittlement layer by a first heat treatment;

forming a third insulating film over the first single-crystal semiconductor film;

bonding the third insulating film and an insulating substrate to each other; and separating part of the second single-crystal semiconductor substrate along the second embrittlement layer by a second heat treatment to form a second single-crystal semiconductor film over the insulating substrate with the third insulating film, the first single-crystal semiconductor film, the first insulating film, and the second insulating film interposed between the second single-crystal semiconductor film and the insulating substrate, wherein a dose of the first ion doping is higher than a dose of the second ion doping, and wherein a temperature of the first heat treatment is lower than a temperature of the second heat treatment.

2. The method for manufacturing a semiconductor device according to claim 1,
wherein the first ion doping and the second ion doping are performed with at least one of $H^+$, $H_2^+$, and $H_3^+$.

3. The method for manufacturing a semiconductor device according to claim 1,
wherein a dose of the first ion doping is $2.5 \times 10^{16}$ cm$^{-2}$ to $2.7 \times 10^{16}$ cm$^{-2}$,
wherein a dose of the second ion doping is $1.9 \times 10^{16}$ cm$^{-2}$ to $2.1 \times 10^{16}$ cm$^{-2}$,
wherein a temperature of the first heat treatment is 470° C. to 480° C. inclusive, and
wherein a temperature of the second heat treatment is 490° C. to 600° C. inclusive.

4. The method for manufacturing a semiconductor device according to claim 1,
wherein plane orientation of a main surface of the first single-crystal semiconductor substrate is one of (100) and (110), and plane orientation of a main surface of the second single-crystal semiconductor substrate is the other of (100) and (110).

5. The method for manufacturing a semiconductor device according to claim 1, further comprising the step of:
forming an island-shaped second single-crystal semiconductor film by selectively removing the second single-crystal semiconductor film over the insulating substrate, and exposing the first single-crystal semiconductor film by removing part of the first insulating film and part of the second insulating film over the insulating substrate.

6. A method for manufacturing a semiconductor device, comprising the steps of:
forming a first insulating film over a surface of a first single-crystal semiconductor substrate;
forming a second insulating film over a surface of a second single-crystal semiconductor substrate;
forming a third insulating film over a surface of a third single-crystal semiconductor substrate;
forming a fourth insulating film over a surface of a fourth single-crystal semiconductor substrate;
forming a first embrittlement layer in the first single-crystal semiconductor substrate by a first ion doping through the first insulating film;
forming a second embrittlement layer in the second single-crystal semiconductor substrate by a second ion doping through the second insulating film;
forming a third embrittlement layer in the third single-crystal semiconductor substrate by the first ion doping through the third insulating film;
forming a fourth embrittlement layer in the fourth single-crystal semiconductor substrate by the second ion doping through the fourth insulating film;

bonding the first insulating film and the second insulating film to each other;

bonding the third insulating film and the fourth insulating film to each other;

forming a first single-crystal semiconductor film over the second single-crystal semiconductor substrate with the first insulating film and the second insulating film interposed between the first single-crystal semiconductor film and the second single-crystal semiconductor substrate by separating part of the first single-crystal semiconductor substrate along the first embrittlement layer by a first heat treatment;

forming a third single-crystal semiconductor film over the fourth single-crystal semiconductor substrate with the third insulating film and the fourth insulating film interposed between the third single-crystal semiconductor film and the fourth single-crystal semiconductor substrate by separating part of the third single-crystal semiconductor substrate along the third embrittlement layer by the first heat treatment;

forming a fifth insulating film over the first single-crystal semiconductor film;

forming a sixth insulating film over the third single-crystal semiconductor film;

bonding the fifth insulating film and an insulating substrate to each other;

bonding the sixth insulating film and the insulating substrate to each other; and separating part of the second single-crystal semiconductor substrate along the second embrittlement layer to form a second single-crystal semiconductor film over the insulating substrate with the fifth insulating film, the first single-crystal semiconductor film, the first insulating film, and the second insulating film interposed between the second single-crystal semiconductor film and the insulating substrate and separating part of the fourth single-crystal semiconductor substrate along the fourth embrittlement layer to form a fourth single-crystal semiconductor film over the insulating substrate with the sixth insulating film, the third single-crystal semiconductor film, the third insulating film, and the fourth insulating film interposed between the fourth single-crystal semiconductor film and the insulating substrate by a second heat treatment, wherein a dose of the first ion doping is higher than a dose of the second ion doping, and wherein a temperature of the first heat treatment is lower than a temperature of the second heat treatment.

7. The method for manufacturing a semiconductor device according to claim 6,
wherein the first ion doping and the second ion doping are performed with at least one of $H^+$, $H_2^+$, and $H_3^+$.

8. The method for manufacturing a semiconductor device according to claim 6,
wherein a dose of the first ion doping is $2.5 \times 10^{16}$ cm$^{-2}$ to $2.7 \times 10^{16}$ cm$^{-2}$,
wherein a dose of the second ion doping is $1.9 \times 10^{16}$ cm$^{-2}$ to $2.1 \times 10^{16}$ cm$^{-2}$,
wherein a temperature of the first heat treatment is 470° C. to 480° C. inclusive, and
wherein a temperature of the second heat treatment is 490° C. to 600° C. inclusive.

9. The method for manufacturing a semiconductor device according to claim 6,
wherein plane orientation of a main surface of the first single-crystal semiconductor substrate or the third single-crystal semiconductor substrate is one of (100)

and (110), and plane orientation of a main surface of the second single-crystal semiconductor substrate or the fourth single-crystal semiconductor substrate is the other of (100) and (110).

10. The method for manufacturing a semiconductor device according to claim 6, further comprising the steps of:

forming an island-shaped second single-crystal semiconductor film by selectively removing the second single-crystal semiconductor film over the insulating substrate, and exposing the first single-crystal semiconductor film by removing part of the first insulating film and part of the second insulating film over the insulating substrate; and forming an island-shaped fourth single-crystal semiconductor film by selectively removing the fourth single-crystal semiconductor film over the insulating substrate, and exposing the third single-crystal semiconductor film by removing part of the third insulating film and part of the fourth insulating film over the insulating substrate.

* * * * *